(12) United States Patent
Sugimoto et al.

(10) Patent No.: US 6,874,910 B2
(45) Date of Patent: Apr. 5, 2005

(54) LIGHT SOURCE DEVICE USING LED, AND METHOD OF PRODUCING SAME

(75) Inventors: Masaru Sugimoto, Osaka (JP); Eiji Shiohama, Katano (JP); Hideyoshi Kimura, Hirakata (JP); Takuma Hashimoto, Yawata (JP); Toshiyuki Suzuki, Nara (JP); Kazuya Nakagawa, Hirakata (JP); Mitsuru Kobayashi, Mie (JP); Jiro Hashizume, Hirakata (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/398,660

(22) PCT Filed: Dec. 3, 2001

(86) PCT No.: PCT/JP01/10561

§ 371 (c)(1),
(2), (4) Date: Apr. 14, 2003

(87) PCT Pub. No.: WO02/084750

PCT Pub. Date: Oct. 24, 2002

(65) Prior Publication Data

US 2003/0189830 A1 Oct. 9, 2003

(30) Foreign Application Priority Data

Apr. 12, 2001 (JP) .......................................... 2001-114502

(51) Int. Cl.⁷ .......................... F21V 29/00; H01L 33/00
(52) U.S. Cl. ...................... 362/294; 362/310; 362/267; 362/293; 362/800; 257/98; 438/116
(58) Field of Search ................................. 362/294, 293, 362/310, 267, 800, 555, 545, 373, 265; 257/100, 98, 712; 438/116, 28, 29, 64

(56) References Cited

U.S. PATENT DOCUMENTS

| | | | | |
|---|---|---|---|---|
| 4,935,665 A | * | 6/1990 | Murata | 313/500 |
| 5,813,753 A | * | 9/1998 | Vriens et al. | 362/293 |
| 5,985,696 A | | 11/1999 | Brunner et al. | 438/116 |
| 6,517,218 B2 | * | 2/2003 | Hochstein | 362/294 |
| 6,531,328 B1 | * | 3/2003 | Chen | 438/26 |

FOREIGN PATENT DOCUMENTS

| | | |
|---|---|---|
| JP | 59176166 | 11/1984 |
| JP | 61158606 | 7/1986 |

(Continued)

OTHER PUBLICATIONS

English Language Abstract of JP 1–311501.

(Continued)

Primary Examiner—Thomas M. Sember
Assistant Examiner—Bao Q. Truong
(74) Attorney, Agent, or Firm—Greenblum & Bernstein, P.L.C.

(57) ABSTRACT

A light source apparatus having a radiator plate having thermally conductive properties and an insulating member coupled to at least one side of the radiator plate having a through hole provided in a side thereof facing the radiator plate. The light source apparatus further including a LED chip installed and thermally coupled to an exposed portion of the radiator plate facing the through hole, an extension inwardly projecting at the through hole from the radiator plate end of the insulating member, and a wiring pattern provided on the insulating member electrically isolated by the insulating member from the radiator plate. The light source apparatus also including bonding wires electrically connecting portions of the wiring pattern on the extension and the electrodes of the LED chip, and a light-transmissive sealing material filling the through hole for entirely encapsulating the LED chip and the bonding wires.

22 Claims, 20 Drawing Sheets

FOREIGN PATENT DOCUMENTS

| | | |
|---|---|---|
| JP | 62174980 | 7/1987 |
| JP | 62235787 | 10/1987 |
| JP | 1-311501 | 12/1989 |
| JP | 2-229477 | 9/1990 |
| JP | 4-10670 | 1/1992 |
| JP | 7-307492 | 11/1995 |
| JP | 11298048 | 10/1999 |
| JP | 2000-82849 | 3/2000 |
| JP | 2000-174350 | 6/2000 |
| JP | 2000-223749 | 8/2000 |
| JP | 2000-323755 | 11/2000 |
| WO | 97/12404 | 3/1997 |

OTHER PUBLICATIONS

English Language Abstract of JP 62–235787.
English Language Abstract of JP 11–298048.
English Language Abstract of JP 7–307492.
English Language Abstract of JP 4–10670.
English Language Abstract of JP 2000–323755.
English Language Abstract of JP 2–229477.
English Language Abstract of JP 62–174980.
English Language Abstract of JP 2000–174350.
English Language Abstract of JP 2000–223749.
English Language Abstract of JP 2000–82849.

* cited by examiner

LIGHT SOURCE DEVICE USING LED, AND METHOD OF PRODUCING SAME

TECHNICAL FIELD

The present invention relates to a light source apparatus using a light emitting diode (LED) and a method of producing the same.

BACKGROUND ART

One of such light source apparatuses is a bullet shaped LED lamp as shown in FIG. 24. The LED lamp may employ a single LED or an array of LEDs mounted on a lead frame 31.

The bullet shaped LED lamp is commonly fabricated by die bonding an LED chip 2 into a recess 31a provided in a metal lead frame 31 using a die bonding paste 7 such as silver paste or epoxy resin. Then, the electrodes (not shown) provided on the LED chip 2 are wire bonded to the lead frames 31 and 32 by bonding wires 9 of a thread metal such as gold. Finally, the LED chip 2, the lead frames 31 and 32, and the bonding wires 9 are encapsulated in a light transmissible sealing resin 33.

The sealing resin 33 is generally an epoxy resin material. The sealing resin 33 has three major functions. The first is a protective function. The sealing resin 33 protects the internal components from mechanical damage as well as the LED chip 2 from water. The second function is to improve the light pickup efficiency. As the LED chip 2 has as a high index of refraction as about 2.8, its interface with the air may introduce total internal reflection resulting from a difference in the refraction index. This will decline the light pickup efficiency of the LED chip 2. The LED chip 2 can thus be coated at the surface with the epoxy resin which has a refraction index of about 1.8 for minimizing the total internal reflection and increasing the light pickup efficiency. The third is a light controlling function. The sealing resin 33 provides an effect of lens at the surface by which the light emitted from the LED chip 2 can be converged or scattered. This effect can thus control the light.

Also, the lead frames 31 and 32 have three functions. The three functions are to support the LED chip 2 by acting as a bed during the die bonding of the LED chip 2, direct the light of the LED chip 2 towards the front with their sides at the recess 31a, where the LED chip 2 is die bonded, serving as mirrors, and dissipate heat from the LED chip 2 to the outside by thermal conductivity of a radiator plate 30.

The LED chip 2 remains high in the light emitting efficiency when the temperature is low in a normal range of use as a lighting device. Its light emitting efficiency will decline when the temperature is high. This is because the grid oscillation is promoted by a rise in the temperature thus increasing the non-radiant coupling between electrons and holes. The LED chip 2 may be a major heat generating component in the common LED light source apparatus. It is hence an important task for improving the light emitting efficiency of the LED chip 2 to readily dissipate heat generated by the LED chip 2 and decline the temperature of the LED chip 2.

Also, when its temperature rise is declined by increasing its effect of heat radiation, the LED chip 2 can be driven by a higher rate of input current in the forward direction. The higher the current, the more the emission of light from the LED chip 2 can be increased. Also, as the effect of heat radiation is improved, the operating life of the LED chip 2 can increase.

The operating life of the LED chip 2 may be increased by two aspects. The first aspect is now explained. Assuming that the operating life of a red light emitting diode ends up when the flux of its emitting light is declined to about 70% of the initial level, the LED chip 2 may last substantially sixty thousands hours. However, when the LED chip 2 is energized with a forward direction current greater than the rated level and thus driven under overload conditions, its performance will acceleratedly be declined by its own heat. The LED chip 2 can thus be prevented from increasing the temperature by improving the effect of heat radiation. Accordingly, the operating life of the LED chip 2 will hardly be declined but increased.

The second aspect is explained. In general, blue light emitting diodes or white light emitting diodes where blue light emitted by blue LEDs is converted into white light are higher in the energy of emitted light than red light emitting diodes. This causes the sealing resin 33 encapsulating the LED chip 2 to be gradually deteriorated and tinted to brown by the energy of emitted light from the LED chip 2. More specifically, once having been tinted, the sealing resin 33 may absorb more blue light and its tinting will be accelerated. Finally, the sealing resin 33 encapsulating the LED chip 22 is turn to brown. Accordingly regardless of the flux of emitted light from the LED chip 2 remaining at its almost initial level, the intensity of light passing through the sealing resin 33 will significantly be declined. Since the sealing resin 33 is susceptible to tinting to brown, the actual operating life of the LED chip 2 using a blue LED or a white LED, which is determined by the flux of light measured at the outside, is as low as about 6000 hours which is far shorter than that of any red light emitting diode. The tinting to brown of the sealing resin 33 is caused by a photochemical reaction. It is generally known that the speed of the photochemical reaction will be accelerated when the temperature of the sealing resin 33 rises up. Accordingly, the operating life of the LED chip 2 can successfully be improved by increasing the effect of heat radiation from the LED chip 22 thus to decline the temperature of the LED chip 22 and the sealing resin 33 and minimize the tinting to brown of the sealing resin 33 derived from the emission of light from the LED chip 2.

It is hence very important for the light source apparatus with LED, in view of improving the efficiency of light emission, increasing the intensity of light output, and extending the operating life, to improve the effect of heat radiation from the LED chip 2 to the outside. The bullet shaped LED lamp has two passages for dissipating heat from the LED chip 2 via the lead frame 31 to the radiator plate 30 and via the sealing resin 33 to the air. However, the passage of dissipating through the sealing resin 33 may fail to provide a desired level of the heat radiation effect because the thermal conductivity of the epoxy resin is rather low. Accordingly, the passage of dissipating heat via the lead frame 31 is preferably chosen. Yet, this passage is as long as 7 to 10 mm with the lead frame 31 arranged too narrow and its assisted heat radiation effect may stay unsatisfactory although is greater than the heat radiation effect with the passage through the sealing resin 33. As the result, the conventional light source apparatus finds it difficult to improve the effect of heat radiation.

For improvement of the heat radiation effect, a modification of the light source apparatus is disclosed in Japanese Patent Laid-open Publication (Heisei)1-311501. The modification is illustrated in FIG. 25. The modified light source apparatus has LED chips 92 mounted on a metal base printed circuit board 91 which is shaped by press forming. More specifically, the printed circuit board 91 is fabricated by providing an insulating layer 913 of e.g. an epoxy resin and a layer of wiring copper foil on a thin metal substrate 912 of e.g. aluminum, etching the wiring copper foil layer to form a wiring pattern 915, and press forming the assembly to shape a desired number of recesses 911. Then, the LED chip 92 is die bonded to the wiring pattern 915 on the insulating layer 913 at each recess 911. The LED chip 92 is electrically connected at its surface electrode to another end of the wiring pattern 915 which is isolated from the die bonded end of the wiring pattern 915. Finally, the recess 911 is filled with a sealing resin 96 to complete the modified light source apparatus.

The modified light source apparatus has the LED chips 92 die bonded by a die bonding paste to the wiring pattern 915. This allows heat released from the LED chips 92 to propagate to the die bonding paste, the wiring pattern 915, the insulating layer 913, and the metal substrate 912. The heat is then dissipated throughout the metal substrate 912. Accordingly, the heat dissipating passage is shorter than that of the conventional bullet shaped LED lamp and the efficiency of heat radiation can be improved.

However, the heat dissipating passage of the modification still includes the die bonding paste, the wiring pattern 915, and the insulating layer 913 which may interrupt the effect of heat radiation. The die bonding paste is commonly a silver particles dispersed resin material where the silver particles increase the thermal conductivity as compared with a simple resin composition and the overall thickness is as small as several tens micrometers and can scarcely interrupt the effect of heat radiation. The wiring pattern 915 consists mainly of the copper plated layer and its thermal conductivity is high enough to hardly decline the effect of heat radiation. The insulating layer 913 contains a ceramic filler dispersed into the resin base and its thermal conductivity is lower than that of the metal layers. Also, the insulating layer 913 is as great as 300 micrometers in the thickness and can thus interrupt the effect of heat radiation.

The modified light source apparatus having the arrangement shown in FIG. 25 is higher in the effect of heat radiation from the LED chip 92 than the conventional bullet shaped LED lamp but fails to improve the effect of heat radiation because its insulating layer 913 interrupts the heat dissipating passage.

When the LED chip has both p electrode and n electrode on one side thereof, it can directly be joined by die bonding to the insulating layer. There is still the insulating layer which declines the thermal conductivity. It is hence apparent that the thermal conductivity is never improved by the simple assembly of a wiring pattern of foil, an insulating layer, and a metal substrate.

When the conventional light source apparatus shown in FIG. 24 is intended to emit white light from a combination of the blue LED chip and the fluorescent member, the two regions 33a and 33b should be filled with different sealing resins. The sealing resin 33b contains fluorescent particles dispersed into a resin base for conversion of the blue light into white light. In case that the two sealing resins are identical in the composition, their filling process has to be divided into two steps because one of the sealing resins is mixed with the fluorescent particles. As the two steps are involved, the interface between the two sealing resins 33a and 33b may be developed. More specifically, there are a difference in the thermal expansivity and a difference in the elasticity between the two sealing resins 33a and 33b. Accordingly, when the bonding wire pattern 9 extends across the interface, it may encounter disconnection of its wire.

The present invention has been developed in view of the foregoing drawbacks and its object is to provide a light source apparatus which is improved in the efficiency of light emission to gain the intensity of light output and expand the operational life while is increased in the mechanical strength.

DISCLOSURE OF THE INVENTION

In order to achieve the above mentioned object, an aspect of the present invention provides a light source apparatus for emitting light from an LED chip, comprising: a radiator plate having thermally conductive properties; an insulating member provided on at least one side of the radiator plate and having a through hole provided in the side thereof facing the radiator plate; the LED chip mounted on and thermally coupled to an exposed portion of the radiator plate facing the through hole; a wiring pattern provided on the insulating member and electrically isolated by the insulating member from the radiator plate; connecting members electrically connecting between the wiring pattern and the electrodes of the LED chip.

As the LED chip is installed and thermally coupled to the exposed portion of the radiator plate facing the through hole in the insulating member, its generated heat can be dissipated through the thermally conductive radiator plate thus contributing to the improvement of the effect of heat radiation of the light source apparatus. This can minimize an increase in the temperature of the LED chip and prevent declination of the light emission efficiency caused by the temperature increase. Also, the LED chip is minimized in the increase of the temperature and can thus be energized with a greater forward current hence increasing the intensity of light emission. Moreover, as its LED chip and sealing material are avoided from dramatic deterioration, the light source apparatus can be increased in the operating life.

Preferably, the improved light source apparatus mentioned above further comprises a sealing material filled in the through hole for entirely encapsulating the LED chip and the connecting members. In the case where the connecting members for electrically connecting between the LED chip and the wiring pattern are metal wires, they can be avoided from being injured and cut apart by any stress developed at the resin interface hence allowing the mechanical strength to be improved.

Preferably, in the improved light source apparatus, the portions of the wiring pattern electrically connected by the connecting members to the LED chip are located in the through hole and held closer to the radiator plate provided side than the other side of the insulating member where the radiator plate is not provided. Similar to the previous feature, the LED chip and the connecting members are encapsulated in the sealing material. As the connecting members for electrically connecting between the LED chip and the wiring pattern are metal wires, they can be avoided from being injured and cut apart by any stress developed at the resin interface hence allowing the mechanical strength to be improved.

In the improved light source apparatus, the portions of the wiring pattern electrically connected by the connecting members to the LED chip are preferably located in the through hole which is filled up to its opening with the sealing material. Accordingly, the filling amount of the sealing material can substantially be uniform hence minimizing variations of the quality.

It is preferable in the improved light source apparatus that the insulating member has an inwardly projecting extension thereof provided at the radiator plate provided side of the through hole and arranged on which at least portions of the wiring pattern are disposed, that the radiator plate has a projection provided on the insulating member provided side thereof to insert into the through hole in the insulating member and arranged on which the LED chip is disposed and thermally coupled, and that the portions of the wiring pattern on the extension are electrically connected to the electrodes of the LED chip. This permits the extension to be increased in the thickness by a distance equal to the height of the projection. Accordingly, the extension can easily be shaped and increased in the thickness thus improving its rigidity. When the insulating member is coupled to the radiator plate, its extension can be prevented from having a distance from the radiator plate.

In the above, it is preferable that the connecting members are metal wires, and one side of the LED chip to which each metal wire is connected at one end is substantially flush with one side of the wiring pattern to which the other end of the each metal wire is connected along the direction of coupling between the insulating member and the radiator plate. This allows the metal wires for electrically connecting between the LED chip and the wiring pattern to be minimized in the length and hence increased in the mechanical strength. Also, as the LED chip is set substantially equal in the height to the wiring pattern, the wire bonding between the two components can be facilitated.

Preferably, in the above, the top of the projection on which the LED chip is mounted is substantially flush with one side of the wiring pattern to which the LED chip is electrically connected along the direction of coupling between the insulating member and the radiator plate. Accordingly, the light emitted from the LED chip can hardly be interrupted by the wiring pattern. As loss of the light is reduced, the efficiency of light pickup can thus be increased.

In the above, the projection is preferably shaped by stamping the radiator plate from the other side opposite to the insulating member provided side to raise a corresponding region of the insulating member provided side. This minimizes the cost of shaping the projection as compared with by machining. Also, when the radiator plate is bonded by the adhesive to the insulating member, it may be deflected towards the insulating member by thermal shrinkage of the adhesive. The radiator plate can be turned in a direction opposite to the insulating member by the punching process from the back side. Accordingly, the deflection by thermal shrinkage of the adhesive can be offset thus remaining the radiator plate avoided comprehensively from being deflected.

In the above, the radiator plate preferably comprises a base plate having a through hole provided therein for communicating with the through hole and a projection fitted into the through hole so that its top extends into the insulating member and acts as the projection. This can facilitate the preparation of the projection as compared with by machining.

When the adhesive is applied for bonding between the radiator plate and the insulating member, its abundant portion may escape from the interface between the radiator plate and the insulating member and interrupt the light emitted from the LED chip or prevents the installation of the LED chip. Since the gap is developed between the through hole and the projection, it can receive the abundant portion of the adhesive. Accordingly, the adhesive remains not reaching the top of the projection and can hardly interrupt the light emitted from the LED chip nor prevent the installation of the LED chip.

It is preferable in the improved light source apparatus that at least either the insulating member or the radiator plate has a groove provided about the through hole in the coupling side thereof to accept an adhesive for coupling between the insulating member and the radiator plate.

Similarly, when the adhesive is applied for bonding between the radiator plate and the insulating member, its abundant portion may escape from the interface between the radiator plate and the insulating member and interrupt the light emitted from the LED chip or prevents the installation of the LED chip. As any abundant portion of the adhesive is successfully received by the groove, it can be avoided from escaping out. Also, if the adhesive is applied short between the radiator plate and the insulating member, the sealing material may run through the absence of the adhesive. As the groove for receiving the abundant portion of the adhesive is provided about the hole in the insulating member, its received adhesive is held about the projection of the radiator plate. Accordingly, the adhesive in the groove acts as a dam and can thus prevent running out of the sealing material.

In the improved light source apparatus, preferably, the radiator plate is made of an electrically conductive material and enables to serve as a portion of the wiring pattern for electrically connecting between the radiator plate and the LED chip. This allows the radiator plate to serve as a part of the wiring pattern. Accordingly, one of the two electrodes of the LED chip is connected to the radiator plate while the other electrode is connected to the wiring pattern for feeding power to the LED chip. The wiring pattern provided on the surface of the insulating member can thus be minimized as providing a single communication. Also, as the radiator plate serves as a part of the circuit for energizing the LED chip, the other end of the circuit can favorably be drawn out to the radiator plate side.

In the above, the radiator plate preferably comprises two or more radiator plate segments which are electrically isolated from each other. When two or more LED chips are installed on the single substrate and the radiator plate is not divided into two or more segments which are electrically isolated from each other, the LED chips may be connected in parallel. The LED chips are however different in the driving voltage and if they are connected in parallel, the least driving voltage LED chip may receive a greater rate of the current and possibly be damaged. It is possible for having the LED energized with a uniform current to connect a current controlling resistor in series with each of the LED chips. However, the current controlling resistors are needed equal to the number of the LED chips and their power consumption loss will increase. According to the present invention, as the radiator plate segments are electrically isolated from each other, their respective LED chips are connected in series. This allows the LED chips to receive substantially a uniform current. Also, the LED chip connected in series are accompanied with the single current controlling resistor. As the result, the current supplied to each LED chip can successfully be controlled thus minimizing the power consumption loss of the current controlling resistor.

In the improved light source apparatus, the sealing material is preferably arranged at the surface of a lens shape for irradiating the light emitted from the LED chip in a desired direction. Accordingly, the light emitted from the LED chip can be irradiated in a desired direction without using a separate lens.

In the improved light source apparatus, the side wall at the through hole of the insulating member is preferably covered with a reflection for reflecting the light emitted from the LED chip in a desired direction. Accordingly, the efficiency of light pickup can be improved.

In the improved light source apparatus, the sealing material has a light color converting function for converting at least a part of the light emitted from the LED chip into a desired color light. Accordingly, the light converted from another color by the sealing material can be combined with the direct light emitted from the LED chip to develop a desired color of light.

It is preferable in the above that the sealing member is located closer to the radiator plate provided side than the other side of the insulating member, and that the side wall at the through hole of the insulating member is covered with a reflection for reflecting the light emitted from the LED chip in a desired direction. Accordingly, as the light emitted from the LED chip is fully diffused when passing through the sealing material, it can easily be controlled for distribution in a desired direction.

In the improved light source apparatus, end portions of the wiring pattern are preferably extended to the radiator plate where they serve as external connector terminals. This allows the wiring pattern to be easily energized from the radiator plate side. While extension portions of the wiring pattern are extended to the radiator plate in various fashions, they may be arranged along the edges of the insulating member to reach the radiator plate. Alternatively, the insulating member may have through holes provided therein and filled with an electrically conductive material for extending the wiring pattern to the radiator plate. Also, the length of the wiring pattern to the radiator plate can be determined to match the requirement of a case as it may be extended to a midway on the insulating member or to the back side of the radiator plate or to a desired portion of the back side of the radiator plate or beyond the radiator plate.

In the above, the end portions of the wiring pattern are preferably extended to the radiator plate provided side of the insulating member. Accordingly, the extension portions of the wiring pattern can easily be energized. It is assumed that the light source apparatus is mounted to a main system which has an opening for accepting the radiator plate. When the radiator plate is simply fitted into the opening of the main system, the extension portions of the wiring pattern which are extended to the radiator plate provided side of the insulating member can readily be connected electrically to corresponding terminals of the main system. Also, as the radiator plate is closely accepted by the opening of the main system, its effect of heat radiation will be more encouraged.

It is preferable in the above that portions of the insulating member are extended to the radiator plate where they are substantially flush with the other side of the radiator plate opposite to the insulating member provided side. When the light source apparatus is anchored to a main system with its insulating member extended to the radiator plate, the extension portions of the insulating member is flush with the other side of the radiator plate where the insulating member is absent. Accordingly, the radiator plate can be seated directly on the main system as the insulating member is joined to the main system. This allows heat generated by the LED chip to be dissipated via the radiator plate to the main system hence improving the effect of cooling down. Also, as the extension portions of the wiring pattern are extended to serve as external connector terminals on the radiator plate, they can easily be connected electrically to corresponding terminals of the main system. Moreover, when its external connector terminals of the wiring pattern are disposed on the extension portions of the insulating member which are extended to the back side of the radiator plate, the light source apparatus of a surface mount type can be improved in the effect of heat radiation.

In the improved light source apparatus, a combination of the insulating member, the LED chip, the wiring pattern, and the sealing material are preferably provided on each side of the radiator plate. Accordingly, the light emitted from the LED chips can be released from both sides of the radiator plate. Also, as two sets of the assemblies are equally mounted on both sides of the radiator plate, they can significantly contribute to the prevention of deflection of the radiator plate.

Another aspect of the present invention provides a method of producing a light source apparatus for emitting light from an LED chip, comprising: a first step of preparing an insulating member which has a through hole provided therein to extend from the front side for emitting the light to the back side; a second step of providing a wiring pattern on the front side of the insulating member for feeding power to the LED chip; a third step of coupling a thermally conductive radiator plate to the back side of the insulating member; a fourth step of installing and thermally coupling the LED chip to a corresponding portion of the radiator plate projected from the through hole and then electrically connecting the electrodes of the LED chip to the wiring pattern by connecting members; and a fifth step of filling the through hole with a sealing material to entirely encapsulate the LED chip and the connecting members.

This method can reduce the cost of forming the LED chip mounting portion as compared with machining the insulating member in a conventional light source apparatus. Also, the LED chip mounting portion can be avoided from being injured thus making the installation of the LED chip easy. Moreover, as the LED chip is thermally coupled to the radiator plate, its generated heat can readily be dissipated from the radiator plate. Since the metal wires provided for electrically connecting between the LED chip and the wiring pattern on the radiator plate are entirely encapsulated together with the LED chip by the sealing material, they can hardly be cut apart by any unwanted stress generated at the resin interface, hence contributing the improvement of the mechanical strength.

A further aspect of the present invention provides a method of producing a light source apparatus for emitting light from an LED chip, comprising: a first step of insert forming an insulating member which is made of an insulating material and has a through hole provided therein opening at both the front side for emitting the light and the back side and a radiator plate which has thermally conductive properties and is coupled to the back side of the insulating member; a second step of providing a wiring pattern on the front side of the insulating member for feeding power to the LED chip; a third step of installing and thermally coupling the LED chip to a corresponding portion of the radiator plate projected from the through hole and then electrically connecting the electrodes of the LED chip to the wiring pattern by connecting members; and a fourth step of filling the through hole with a sealing material to entirely encapsulate the LED chip and the connecting members.

Similar to the previous method, this method can reduce the cost of forming the LED chip mounting portion as compared with machining the insulating member in a conventional light source apparatus. Also, the LED chip mounting portion can be avoided from being injured thus making the installation of the LED chip easy. Moreover, as the LED chip is thermally coupled to the radiator plate, its generated heat can readily be dissipated from the radiator plate. Since the metal wires provided for electrically connecting between the LED chip and the wiring pattern on the radiator plate are entirely encapsulated together with the LED chip by the sealing material, they can hardly be cut apart by any unwanted stress generated at the resin interface, hence contributing the improvement of the mechanical strength.

A further aspect of the present invention provides a method of producing a light source apparatus for emitting light from an LED chip, comprising: a first step of preparing a thermally conductive radiator plate and an electrically conductive sheet arranged to serve as a wiring pattern for feeding power to the LED chip; a second step of plating the radiator plate and the electrically conductive sheet; a third step of insert forming the electrically conductive sheet spaced from the radiator plate to prepare an insulating member of an insulating material; a fourth step of installing and thermally coupling the LED chip to a corresponding portion of the radiator plate projected from a through hole provided in the insulating member opening at the front side for emitting the light and the back side, and then electrically connecting the electrodes of the LED chip to the wiring pattern by connecting members; and a fifth step of filling the through hole with a light-transmissive sealing material to entirely encapsulate the LED chip and the connecting members.

This method can also reduce the cost of forming the LED chip mounting portion as compared with machining the insulating member in a conventional light source apparatus. Similarly, the LED chip mounting portion can be avoided from being injured thus making the installation of the LED chip easy. Moreover, as the LED chip is thermally coupled to the radiator plate, its generated heat can readily be dissipated from the radiator plate. Since the metal wires provided for electrically connecting between the LED chip and the wiring pattern on the radiator plate are entirely encapsulated together with the LED chip by the sealing material, they can hardly be cut apart by any unwanted stress generated at the resin interface, hence contributing the improvement of the mechanical strength.

BEST MODES FOR EMBODYING THE INVENTION

Some embodiments of the present invention will be described in more detail referring to the relevant drawings.

Embodiment 1

Figure 1:
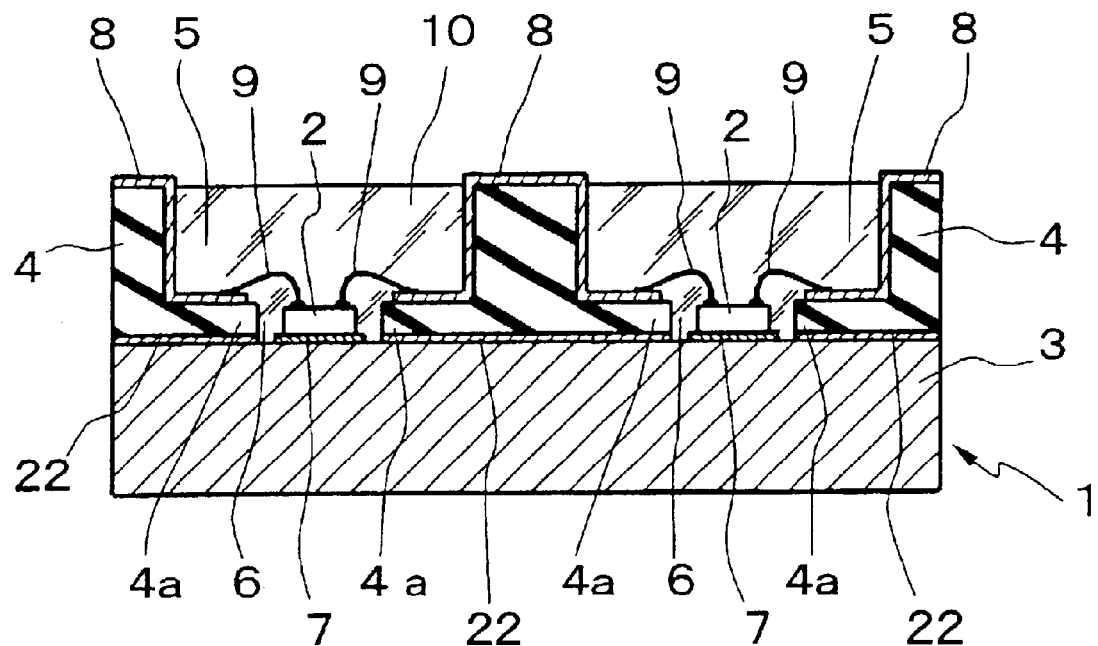
FIGS. 1a and 1b are a cross sectional view and a plan view of a light source apparatus showing Embodiment 1 of the present invention.
Figure 1:
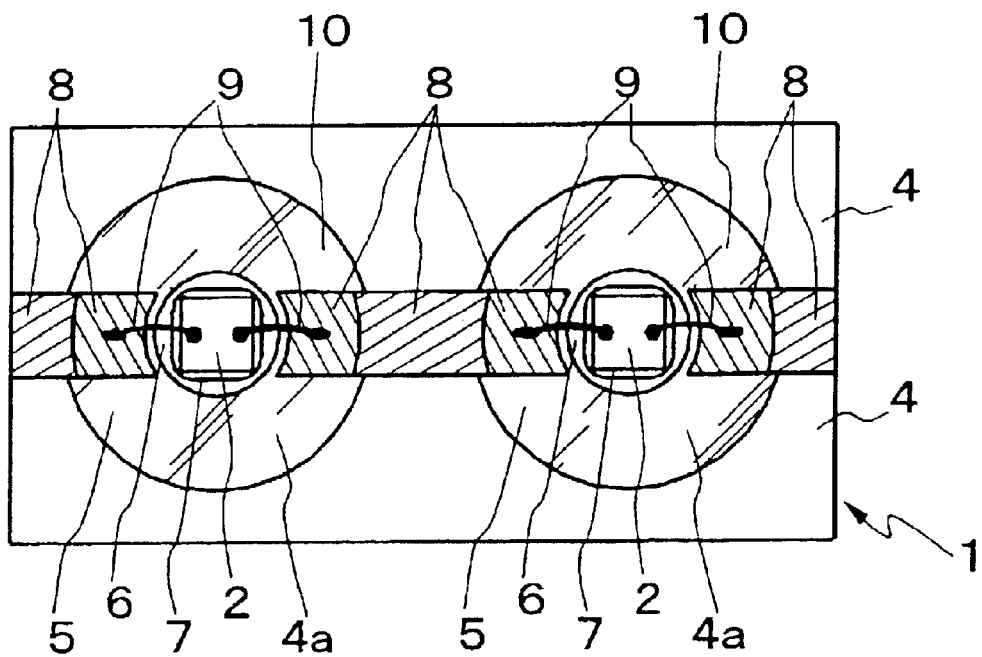

The description starts with Embodiment 1 referring to FIGS. 1a and 1b. A light source apparatus 1 of this embodiment includes a light emitting diode or a LED chip 2 for emitting the light. The LED chip 2 is thermally coupled at one side to a radiator plate 3 for radiation of heat from the LED chip 2 while the other side of the LED chip 2 emits the light.

The light source apparatus 1 has the radiator plate 3 made of, e.g., a substantially 2 mm thick thermally conductive material such as aluminum and joined by an adhesive 22 with an insulating member 4 made of, e.g., a substantially 2 mm thick insulating material such as liquid crystal polymer. The insulating material may be not only the polymer but a mixture of an inorganic material, such as aluminum or zirconium, and an (organic) binder processed through compounding, injection forming, degreasing (to remove the organic material), and baking.

The insulating member 4 has two round recesses 5 of about 3 mm in diameter and about 1.5 mm in depth provided in the upper side thereof where the radiator plate 3 is absent. Also, the insulating member 4 has a through hole 6 of about 1 mm in diameter provided in a substantially center region at each round recess thereof and arranged of a substantially round shape in the cross section. More specifically, the insulating member 4 has an inwardly projecting extension 4a thereof provided at the bottom of each round recess 5 and arranged integral with the radiator plate 3 as defined by the through hole 6. The LED chip 2 is die bonded by a die bonding paste 7, such as silver paste, to each exposed surface of the radiator plate 3 as seated in the through hole 6. A wiring pattern 8 of an electrically conductive material, such as copper, is provided on the upper side of the insulator member 4 where the radiator plate 3 is absent, extending along a straight line across the installation areas of the two LED chips 2. The wiring pattern 8 is extended along the side wall and the bottom (the extension 4a) at each round recess 5 of the insulating member 4 thus to provide connector regions for wire bonding. The two electrodes (not shown) of the LED chip 2 are electrically connected by bonding wires (joining members) 9, such as gold thin leads, to the connector regions of the wiring pattern 8. The connector regions of the wiring pattern 8 to which the bonding wires 9 are joined are preferably gold plated for ease of bonding the bonding wires 9. Also, as the upper side of the LED chip 2 is flush with the connector regions of the wiring pattern 8 provided on the bottom at the round recess 5 of the insulating member 4, the bonding wires 9 are minimized in the length and their mechanical strength can thus be increased while their bonding process can be carried out with ease.

Then, the round recesses 5 and the through holes 6 are filled with a sealing resin (a sealing material) 10, such as light transmissive two-liquid curable epoxy resin, which thus encapsulates the LED chips 2 and the bonding wires 9 therein. Also, the joining ends of the bonding wires 9 are protected with the sealing resin 10. Since the sealing resin 10 is poured up to the upper surface of the insulating member 4, its filling amount can easily be controlled. The bonding wires 9 are coupled to the connector regions of the wiring pattern 8 on the extensions 4a and accommodated in the round recesses 5 and the through holes 6. As the bonding wires 9 and their connector regions are protected with the sealing resin 10 filled in the round recesses 5 and the through holes 6, they will neither be exposed from the sealing resin 10 nor declined in the mechanical strength. Accordingly, the bonding wires 9 can be avoided from being injured and disconnected by any external stress at the outside of the sealing resin 10.

The LED chip 2 described is, but not limited to, a GaN LED chip having two electrodes provided on the upper side thereof and may be any other applicable LED chip such as AlInGaP LED chip having one of two electrodes provided on the upper side and the other on the lower side thereof. In the latter case, the radiator plate 3 can be used directly as a wiring lead or provided with an electrode terminal to which one end of the LED chip 2 is connected while the other end is connected to the wiring pattern 8.

As described, the LED chips 2 of the light source apparatus 1 of this embodiment are directly joined by die bonding to the radiator plate 3 which is high in the thermal conductivity and their generated heat can readily be propagated via the die bonding paste 7 to the radiator plate 3 and then quickly dissipated throughout the radiator plate 3. Although the passage of dissipating the heat from the LED chip includes the die bonding paste 7 which is low in the thermal conductivity, its thickness is as small as some micrometers. Accordingly, as the effect of heat radiation is scarcely interrupted by the die bonding paste 7, it can remain sufficiently high. For example, the thermal resistance from the LED chip 2 to the radiator plate 3 in the light source apparatus 1 of this embodiment is 90° C./W while the same from the LED chip to the lead frame of the conventional bullet shaped LED lamp is about 350° C./W. More particularly, the thermal resistance of the embodiment can successfully be declined to substantially one fourth.

The effect of heat radiation from the LED chips 2 can thus be improved as compared with that of the conventional light source apparatus. As the result, the LED chips 2 can be inhibited from rising its temperature and its efficiency of light emission can be increased thus gaining a higher level of the light output and extending the operational life. Also, the LED chips 2 and the bonding wires 9 are encapsulated with the sealing resin 10 while the joining ends of the bonding wires 9 are protected with the sealing resin 10. Accordingly, the bonding wires 9 are protected from any unwanted external stress and its physical disconnection will be minimized while its mechanical strength will be increased.

The material of the radiator plate 3 in this embodiment is not limited to aluminum but may be selected from other appropriate metals including copper and ceramics which are high in the thermal conductivity, e.g., nitriding alminum, and used with equal success. Although the wiring pattern 8 in this embodiment is deposited on the insulating member 4 by a known printing technique, it may be placed by a lead frame (not shown) which is extended through the insulating member 4 and exposed at its joining regions adjacent to the LED chips 2 for connection with the bonding wires 9. Also, the light source apparatus is not limited to the two LED chips 2 in this embodiment but may employ one LED chip which is sized enough to provide a desired area and a desired intensity of the light emission or three or more LED chips when necessary.

Embodiment 2

Figure 2:
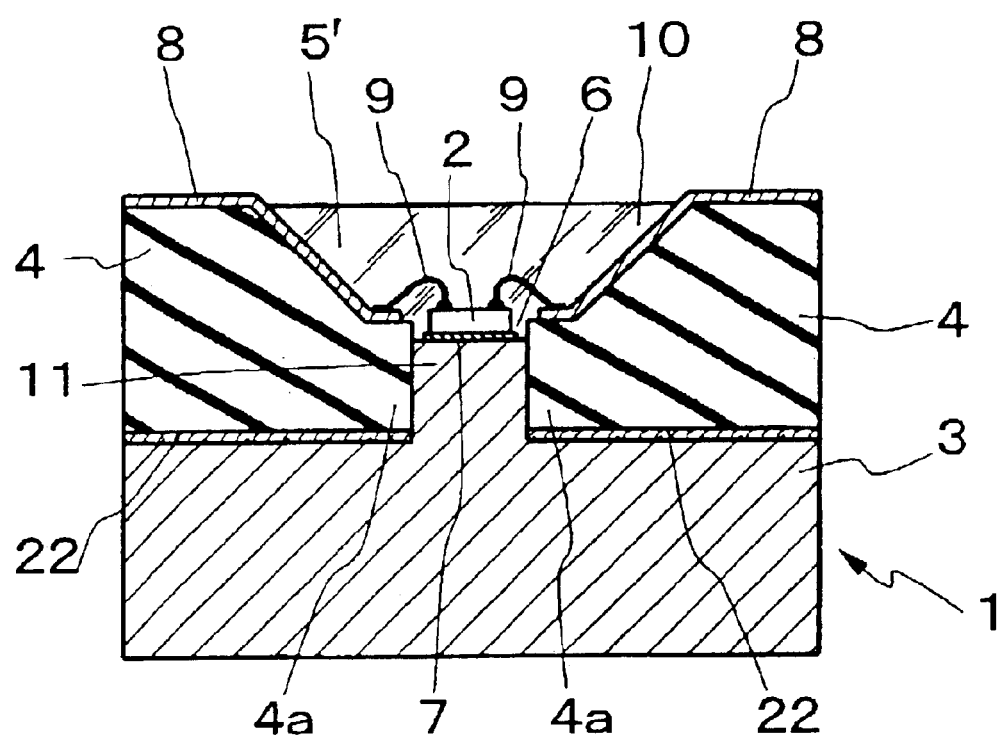
FIG. 2 is a cross sectional view of a light source apparatus showing Embodiment 2 of the present invention.

Embodiment 2 of the present invention will be described referring to FIG. 2. A light source apparatus 1 of this embodiment has a radiator plate 3 made of, e.g., a thermally conductive material such as aluminum and joined by an adhesive 22 with an insulating member 4 made of, e.g., a substantially 2 mm thick insulating material such as liquid crystal polymer.

The radiator plate 3 is fabricated by machining an aluminum sheet of substantially 3 mm thick. More particularly, the radiator plate 3 has a projection 11 of a substantially round column shape provided on the insulating member 4 side thereof which is about 1 mm in the diameter and about 0.9 mm in the height.

The insulating member 4 has a round recess 5' provided in the upper side thereof, where the radiator plate 3 is absent, to situate opposite to the projection 11 of the radiator plate 3. Also, the insulating member 4 has a through hole 6 provided in a center region at the bottom of the round recess 5' thereof. The diameter of the through hole 6 is about 1 mm which is substantially identical to the outer diameter of the projection 11. The bottom of the round recess 5' is about 2 mm in the diameter. As the side wall at the round recess 5' of the insulating member 4 becomes greater in the inner diameter as departing from the radiator plate 3, it is outwardly tilted at substantially 45 degrees in the cross section. The insulating member 4 has an inwardly projecting extension 4a thereof provided at the bottom of the round recess 5' and arranged integral with the radiator plate 3 as defined by a combination of the round recess 5' and the through hole 6 therein which is situated opposite to the projection 11 of the radiator plate 3.

The radiator plate 3 and the insulating member 4 are coupled to each other with the projection 11 fitted into the through hole 6. An LED chip 2 of about 0.2 mm thick is die bonded by a die bonding paste 7, such as silver paste, to the exposed surface at the through hole 6 of the projection 11. A wiring pattern 8 of an electrically conductive material, such as copper, is provided on the upper side of the insulator member 4 where the radiator plate 4 is absent as is plated at the upper surface with gold. The wiring pattern 8 is extended along the side wall and the bottom at the round recess 5' of the insulating member 4. Two electrodes of the LED chip 2 are electrically connected by bonding wires 9, such as gold thin leads, to the connector regions of the wiring pattern 8 located on the bottom (the extension 4a) at the round recess 5' of the insulating member 4.

Then, the round recess 5' and the through holes 6 are filled with a sealing resin (a sealing material) 10, such as light transmissive two-liquid curable epoxy resin, which thus encapsulates the LED chip 2 and the bonding wires 9 therein. Also, the joining ends of the bonding wires 9 are protected with the sealing resin 10. Since the sealing resin 10 is poured up to the upper surface of the insulating member 4, its filling amount can easily be controlled. The bonding wires 9 are coupled to the connector regions of the wiring pattern 8 on the extensions 4a and accommodated in the round recess 5'. As the bonding wires 9 and their connector regions are protected with the sealing resin 10 filled in the round recess 5' and the through holes 6, they will neither be exposed from the sealing resin 10 nor declined in the mechanical strength. Accordingly, the bonding wires 9 can be avoided from being injured and disconnected by any external stress at the outside of the sealing resin 10.

The LED chip 2 of the light source apparatus 1 of this embodiment is die bonded directly to the radiator plate 3 which is high in the thermal conductivity and its effect of heat radiation can be as good as of the light source apparatus of Embodiment 1. As the result, the LED chip 2 can be inhibited from rising its temperature and its efficiency of light emission can be increased thus gaining a higher level of the light output and extending the operational life.

In addition, the radiator plate 3 of the light source apparatus of this embodiment has the projection 11 thereof and allows the extension 4a of the insulating member to be increased in the thickness by the height of the projection 11 orthogonal to the interface between the radiator plate 3 and the insulating member 4 even when the upper surface of the LED chip 2 is flush with the wiring pattern 8 on the extension 4a. Generally speaking in the fabrication of the insulating member 4 from a resin material, the yield of the insulating member 4 may be declined if the thickness of its extension 4a is too small to be configured. Also, during the joining between the radiator plate 3 and the insulating member 4, there may be developed a gap between the two components if the thickness of the extension 4a is too small. The extension 4a of the light source apparatus 1 of this embodiment is about 1 mm in the thickness but about 0.5 mm in the width. This facilitates the step of shaping the extension 4a and permits the radiator plate 3 and the insulating member 4 to be coupled to each other without generating any gap therebetween.

The LED chip 2 like that of the light source apparatus of Embodiment 1 is flush at its upper surface with the wiring pattern 8 on the bottom (the extension 4a) at the round recess 5' of the insulating member 4. Accordingly, the bonding wires 9 are minimized in the length and their mechanical strength can be increased and their bonding process can be carried out with ease. Also, the side wall at the round recess 5' of the insulating member 4 is outwardly tilted and can minimize its adverse action of absorption or scattering of light but favorably reflect and effectively direct the light forward.

Embodiment 3

Embodiment 3 of the present invention will be described referring to FIG. 3a. A light source apparatus 1 of this embodiment is adapted in which the projection 11 of the radiator plate 3 similar to that in the light source apparatus of Embodiment 2 is about 1.1 mm in the height and its upper surface is flush with the top of the wiring pattern 8 disposed on the extension 4a of the insulating member 4. Since the other arrangement than the projection 11 is identical to that of Embodiment 2, like components are denoted by like numerals and will be explained in no more detail.

In the light source apparatus of Embodiment 2, some components of the light emitted from the LED chip 2 which are (horizontally) directed in substantially parallel with the upper surface of the LED chip 2 may be absorbed by or randomly reflected on the tilted wall of the extension 4a and hardly propagated towards the front, thus declining the efficiency of light emission. Advantageously, the light source apparatus 1 of this embodiment has the projection 11 arranged flush at the upper surface with the top of the wiring pattern 8 disposed on the extension 4a of the insulating member 4 and the LED chip 2 mounted by die bonding to the substantially flat plane. This prevents the light emitted from the LED chip 2 from being absorbed by or randomly reflected on the tilted wall of the extension 4a and can improve the light emission efficiency.

Figure 3:
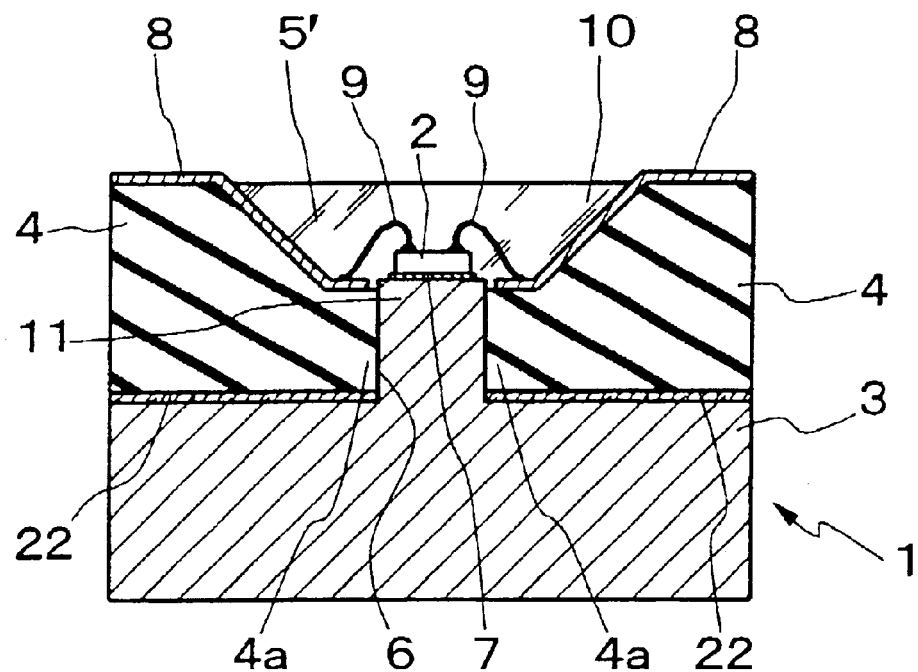
FIGS. 3a and 3b are cross sectional views of a light source apparatus showing Embodiment 3 of the present invention.
Figure 3:
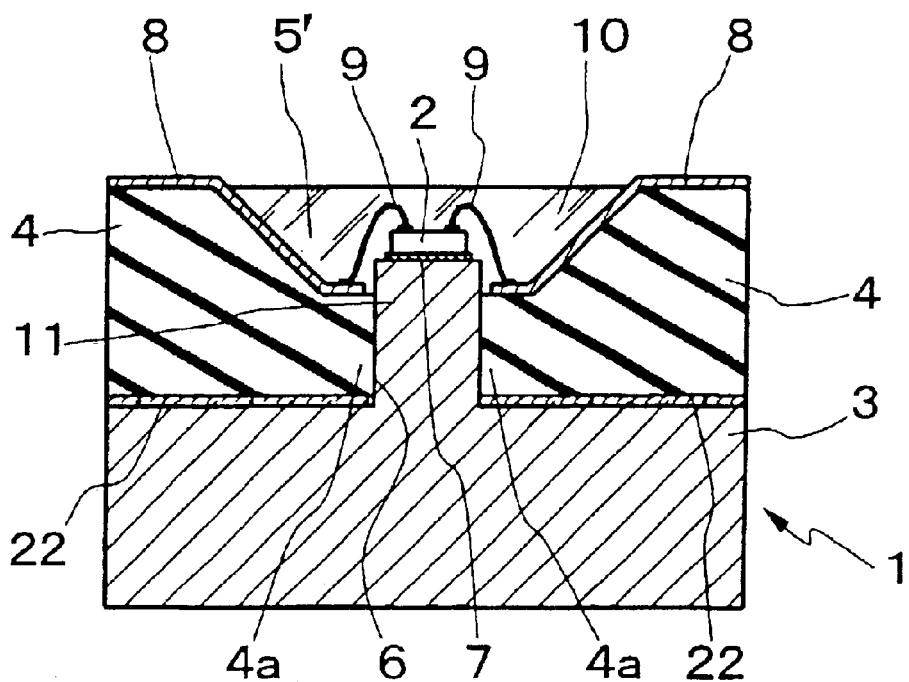

Alternatively, the upper surface of the projection 11 may be raised higher than the top of the wiring pattern 8 disposed on the extension 4a, as shown in FIG. 3b. This equally prevents the light emitted from the LED chip 2 from being absorbed by or randomly reflected on the tilted wall of the extension 4a and can improve the light emission efficiency. If the projection 11 is too high, the length of the bonding wires 9 has to be increased and may touch the edge of the projection 11. Preferably, the upper surface of the projection 11 is leveled substantially equal to or slightly higher than the top of the wiring pattern 8 disposed on the extension 4a.

Embodiment 4

Embodiment 4 of the present invention will be described referring to FIG. 4a. A light source apparatus 1 of this embodiment is adapted in which the projection 11 of the radiator plate 3 similar to that in the light source apparatus of Embodiment 3 is about 0.5 mm in the diameter and about 1.1 mm in the height and its upper surface is flush with the top of the wiring pattern 8 disposed on the extension 4a of the insulating member 4. Since the other arrangement is identical to that of Embodiment 3 except the positioning of the LED chip 2 and the radiator plate 3, like components are denoted by like numerals and will be explained in no more detail.

The LED chip 2 includes a transparent sapphire substrate and has two electrodes thereof distanced by about 1 mm from each other. In particular, the LED chip 2 is spaced from the upper surface of the projection 11 and positioned so that the projection 11 stays between its two electrodes. The LED chip 2 is joined to the wiring pattern 8 with its two electrodes faced down. More specifically, the joining between the LED chip 2 and the wiring pattern 8 is implemented by the following manner. Soldering bumps 21 are provided on the electrodes of the LED chip 2 and heated in a reflow furnace for soldering the bumps 21 to the wiring pattern 8. The soldering bumps 21 have a height of two to three micrometers and can thus electrically isolate the electrodes of the LED chip 2 from the projection 11 of the radiator plate 3 by a distance equal to the height. Also, the space between the LED chip 2 and the projection 11 is filled with the sealing resin 10. However, the distance between the LED chip 2 and the projection 11 is small enough to thermally couple the LED chip 2 with the radiator plate 3 (which preferably is distanced by 10 μm or less from the LED chip 2), hence hardly interrupting the propagation of heat from the LED chip 2 to the radiator plate 3.

In the light source apparatus of Embodiment 3, the LED chip 2 has its electrodes arranged to face the upper side or opening of the recess 5' and its emitted light is partially interrupted by the electrodes. While some of the interrupted light is then reflected before finally released to the outside, the other is internally dissipated and lost. Advantageously, the LED chip 2 in the light source apparatus 1 of this embodiment is provided with its electrodes facing the radiator plate 3. As the light generated by an emitter layer of the LED chip 2 is released from the transparent sapphire substrate, it may hardly be interrupted by the electrodes of the LED chip 2 and the bonding wires 9. Accordingly, the intensity of light output can substantially remain not declined. Also, when the light source apparatus of Embodiment 3 is used in combination with other optical devices such as lenses, the shape of its LED chip 2 may unintentionally be focused and projected on the surface to be illuminated. With the electrodes of the LED chip 2 facing the radiator plate 3, this embodiment has the light emitting side exposed clearly to the front. Also similar to Embodiment 3, the light emitted from the LED chip 2 can scarcely be absorbed by or randomly reflected on the tilted wall of the extension 4a and can improve the light emission efficiency.

Figure 4:
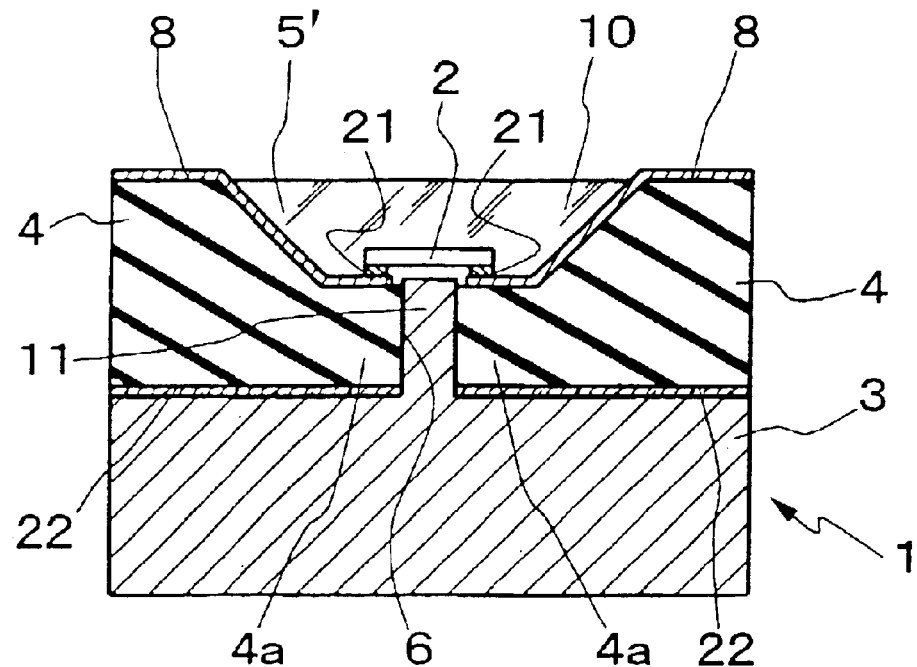
FIGS. 4a and 4b are cross sectional views of a light source apparatus showing Embodiment 4 of the present invention.
Figure 4:
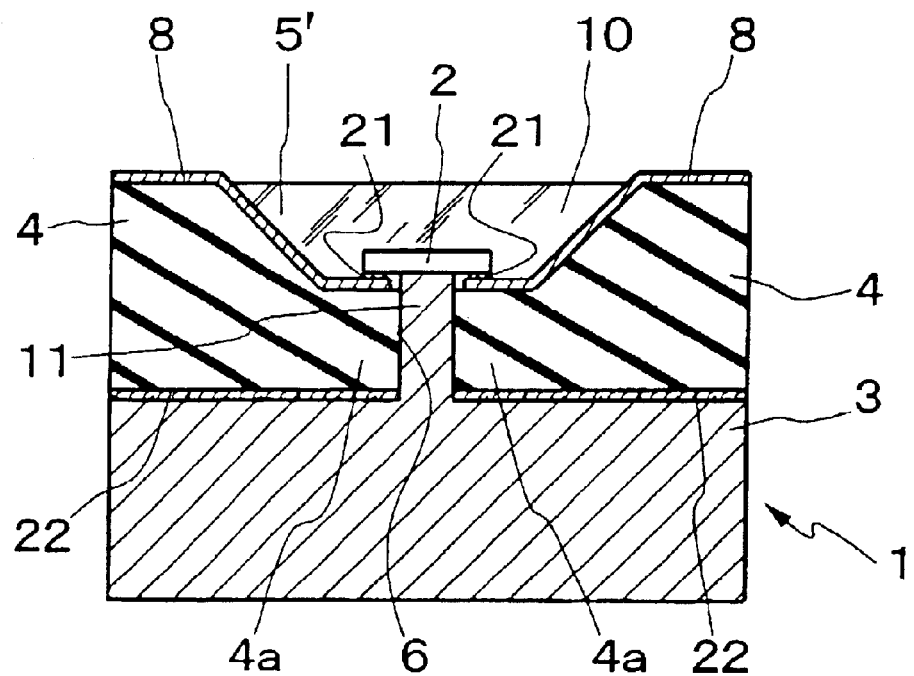

Alternatively, the projection 11 may be raised to be about 3 μm higher at the upper surface than the top of the wiring pattern 8 disposed on the extension 4a of the insulating member 4, as shown in FIG. 4b. The LED chip 2 is then mounted on the upper surface of the projection 11 with its electrodes faced down. As the LED chip 2 is directly placed on the projection 11, its effect of heat radiation can be improved. It is however necessary to isolate the LED chip 2 from the radiator plate 3 by coating the upper surface of the projection 11 or the projection 11 contacting region of the LED chip 2 with an insulating material such as silicon oxide or by using an electrically non-conductive material to form the radiator plate 3. Preferably, the height of the soldering bumps 21 may be increased for eliminating a distance in the elevation between the projection 11 and the wiring pattern 8, hence enhancing the electrical connection between the electrodes of the LED chip 2 and the wiring pattern 8.

The modification of the light source apparatus 1 shown in FIG. 4b also prevents the light emitted from the LED chip 2 from being absorbed by or randomly reflected on the tilted wall of the extension 4a and can improve the light emission efficiency.

Embodiment 5

Figure 5:
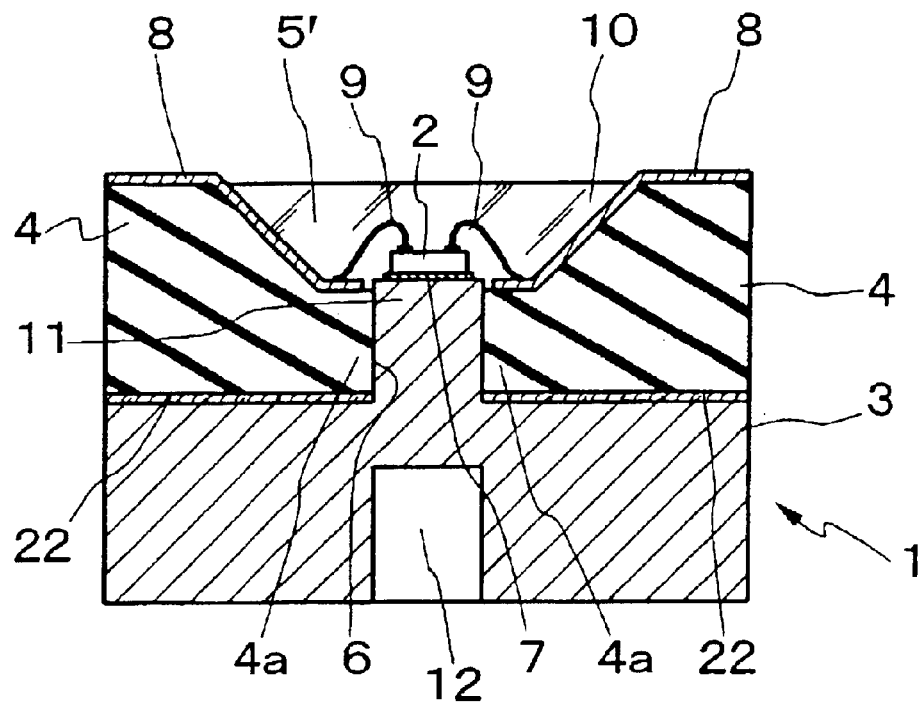
FIG. 5 is a cross sectional view of a light source apparatus showing Embodiment 5 of the present invention.

Embodiment 5 of the present invention will be described referring to FIG. 5. A light source apparatus 1 of this embodiment is adapted in which the radiator plate 3 in the light source apparatus of Embodiment 3 has a recess 12 provided in the lower side thereof to be opposite to the projection 11. Since the other arrangement is identical to that of Embodiment 3 except the recess 12, like components are denoted by like numerals as those of Embodiment 3 and will be explained in no more detail.

In the light source apparatus of Embodiment 3, the projection 11 is shaped by machining the radiator plate 3. The radiator plate 3 in the light source apparatus of this embodiment is subjected to press forming to develop the recess 12 and the projection 11 at once. The press forming step can significantly be decreased in the cost as compared with the machining step.

When the radiator 3 and the insulating member 4 are bonded to each other by an adhesive 22, they may be deflected throughout the length by shrinkage during the curing process of the adhesive 22. The press forming for developing the projection 11 causes the radiator plate 3 to be deflected in a reverse of the direction of deflection produced during the curing process of the adhesive 22. Accordingly, the two stresses of deflection can be offset hence minimizing the deflection of the radiator plate 3 and the insulating member 4.

The heat generated by the LED chip 2 in the light source apparatus 1 of this embodiment is propagated via the die bonding paste 7 to the radiator plate 3. The radiator plate 3 is a solid structure while the recess 12 is provided on the back side of the projection 11. Accordingly, the heat of the LED chip 2 is received by the projection 11 and dissipated readily throughout the radiator plate 3 before released to the outside. In common, the radiator plate 3 is installed directly on a housing or a set of radiating fins which can easily release the heat. As the heat is quickly propagated from the LED chip 2 to the radiator plate 3 and its heat dissipating installation, the effect of heat radiation can be as good as that of the other embodiments which include non of the recess 12.

Embodiment 6

Figure 6:
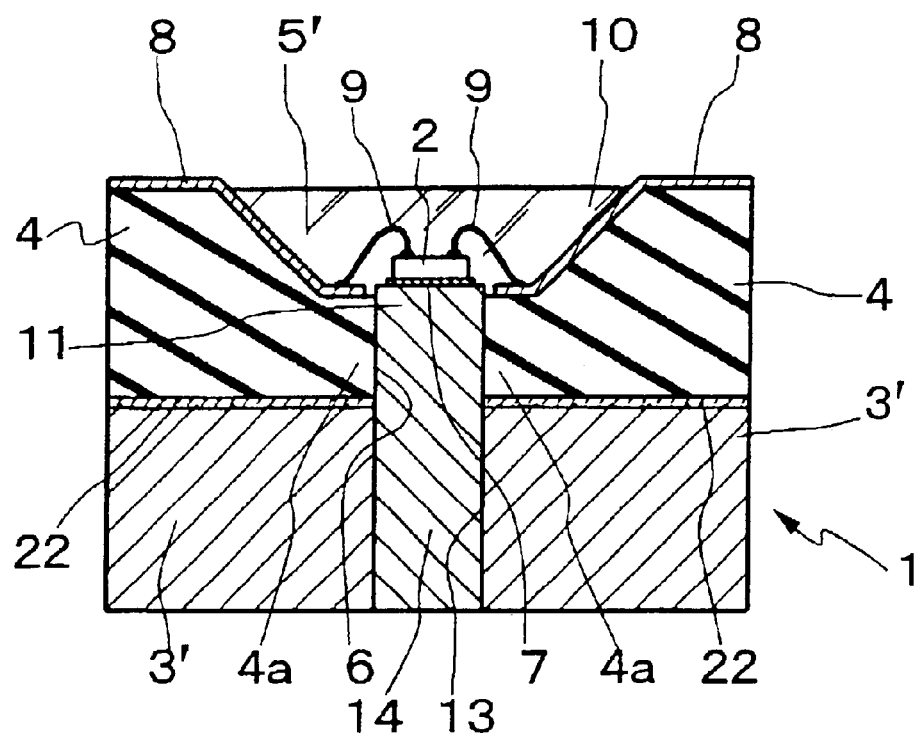
FIG. 6 is a cross sectional view of a light source apparatus showing Embodiment 6 of the present invention.

Embodiment 6 of the present invention will be described referring to FIG. 6. While the projection 11 in the light source apparatus of Embodiment 3 is shaped by machining the radiator plate 3, it is placed by a round column shaped thermally conductive member (projection) 14 which is made of a thermally conductive material such as aluminum and fitted into a through hole 13 of substantially a round shape in the cross section provided in a thermally conductive base plate 3' at a location corresponding to the through hole 6 of the insulating member 4 so that the through hole 13 is communicated with the through hole 6. The base plate 3' and the thermally conductive member 14 constitute a radiator block. A projecting portion of the thermally conductive member 14 inserted from the base plate 3' side into the through hole 6 of the insulating member 4 serves as the projection 11. Then, the LED chip 2 is die bonded by a die bonding paste 7 to the top of the thermally conductive member 14. As the other arrangement of this embodiment is identical to that of Embodiment 3 except the base plate 3' and the thermally conductive member 14, like components are denoted by like numerals and will be described in no more detail.

In the light source apparatus of Embodiment 3, the projection 11 of the radiator plate 3 is shaped by machining a metal strip and its processing cost will be high. This embodiment allows the thermally conductive member 14 to be fitted into the through hole 13 in the base plate 3' so that its projecting portion serves as the projection 11. Accordingly, the processing step can be lower in the cost than the machining of the metal strip to form the projection 11.

When the base plate 3' is joined at its back side to a radiation promoting component such as a housing or a set of radiating fins, the heat generated by the LED chip 2 can be propagated via the die bonding paste 7 to the thermally conductive material 14 which is fitted into the through hole 13 in the base plate 3' as extending to the back side of the base plate 3'. This permits the heat from the LED chip 2 to be readily propagated via the thermally conductive member 14 to the radiation promoting component at the back side. Also, as the thermally conductive material 14 is fitted into and directly joined to the base plate 3', the transfer of heat between the two components can be significant thus encouraging the heat from the thermally conductive material 14 to be readily dissipated throughout the base plate 3'. As the result, the effect of heat radiation of this embodiment will be as good as that of Embodiment 3 where the projection 11 is formed integral with the radiator plate 3.

Embodiment 7

Figure 7:
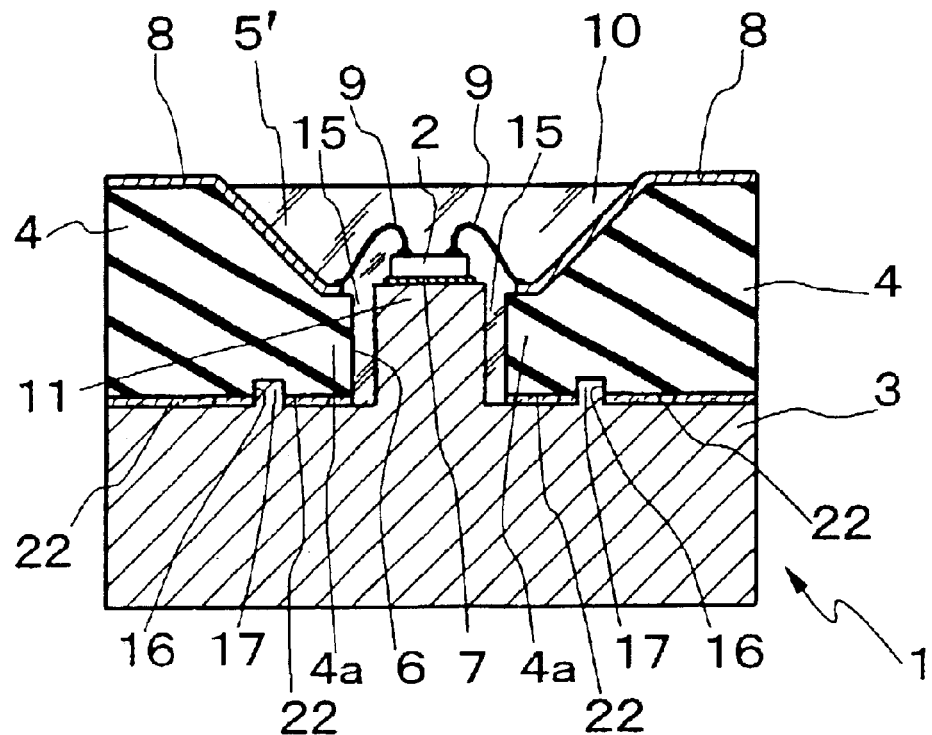
FIG. 7 is a cross sectional view of a light source apparatus showing Embodiment 7 of the present invention.

Embodiment 7 of the present invention will be described referring to FIG. 7. A light source apparatus 1 of this embodiment is a modification of the light source apparatus of Embodiment 3 in which a space 15 is provided between the projection 11 of the radiator plate 3 and the side wall at the through hole 6 of the insulating member 4. The insulating member 4 has a set of positioning recesses 16 provided in the radiator plate 3 (joining) side thereof while the radiator plate 3 has a set of bumps 17 provided in the upper (joining) side thereof for engagement with the corresponding recesses 16 in the insulating member 4. The other arrangement is identical to that of the light source apparatus of Embodiment 3 except the space 15, the recesses 16, and the bumps 17. Accordingly, like components are denoted by like numerals and will be explained in no more detail.

When the radiator plate 3 and the insulating member 4 are joined to each other by an adhesive 22, an redundancy of the adhesive 22 may escape from the interface between the two components. In the light source apparatus of Embodiment 3, a redundancy of the adhesive 22 may remain adjacent to the LED chip 2 thus interrupting partially the light emitted from the LED chip 2. Also, the redundancy of the adhesive 22 stays on the upper surface of the projection 11 and may inhibit the die bonding of the LED chip 2. The light source apparatus 1 of this embodiment has the space 15 provided between the projection 11 and the extension 4a. The redundancy of the adhesive 22 can hence be received by the space 15. This allows the LED chip 2 to be free from the redundancy of the adhesive 22 escaped from the joint thus eliminating the interruption of the light from the LED chip 2 with the redundancy of the adhesive 22 and encouraging the die bonding of the LED chip 2.

Also, the positioning of the radiator plate 3 and the insulating member 4 during the joining process can easily be conducted by the bumps 17 of the radiator plate 3 being readily fitted into the corresponding recesses 16 of the insulating member 4. The bumps 17 of the radiator plate 3 and the corresponding recesses 16 of the insulating member 4 which serve as a positioning means in this embodiment are of no limitation for positioning the radiator plate 3 and the insulating member 4. The positioning between the radiator plate 3 and the insulating member 4 may be implemented by any applicable means.

Embodiment 8

Figure 8:
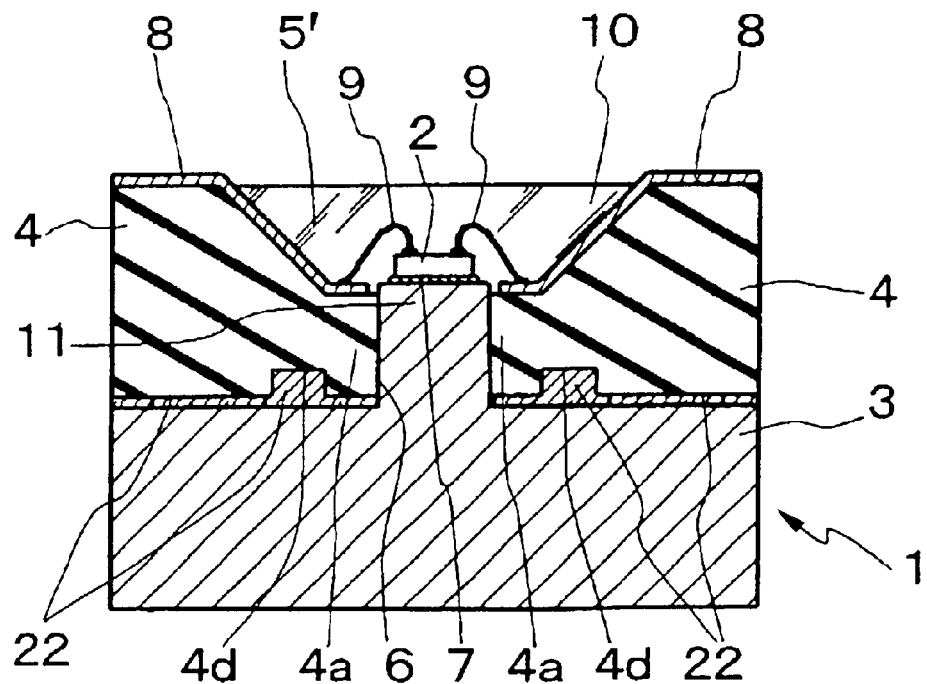
FIG. 8 is a cross sectional view of a light source apparatus showing Embodiment 8 of the present invention.

Embodiment 8 of the present invention will be described referring to FIG. 8. This embodiment is a modification of the light source apparatus of Embodiment 3 where the insulating member 4 has an annular groove 4d of about 1 mm in radius, about 0.5 mm in width, and about 0.3 mm in depth provided about the through hole 6 in the radiator plate 3 side thereof. As the other arrangement than the groove 4d is identical to that of Embodiment 3, like components are denoted by like numerals and will be explained in no more detail.

When the radiator plate 3 and the insulating member 4 are joined to each other by an adhesive 22, a redundancy of the adhesive 22 may escape from the interface between the two components. In the light source apparatus of Embodiment 3, a redundancy of the adhesive 22 may remain adjacent to the LED chip 2 thus interrupting partially the light emitted from the LED chip 2. Also, the redundancy of the adhesive 22 stays on the upper surface of the projection 11 and may inhibit the die bonding of the LED chip 2. The light source apparatus 1 of this embodiment has the groove 4d in the insulating member 4 situated about the through hole 6 into which the projection 11 is fitted. The redundancy of the adhesive 22 can hence be received by the groove 4d and inhibited from running through the through hole 6 and reaching the upper surface of the projection 11.

If the adhesive 22 is irregularly applied and undulated from place to place, gaps may be created in the interface between the radiator plate 3 and the insulating member 4. This causes the sealing resin 10 to escape from the gaps when introduced in the filling step. In this embodiment, the adhesive 22 filled in the groove 4d about the through hole 6 can act as a dam for interrupting the flow of the sealing resin 10.

Embodiment 9

Figure 9:
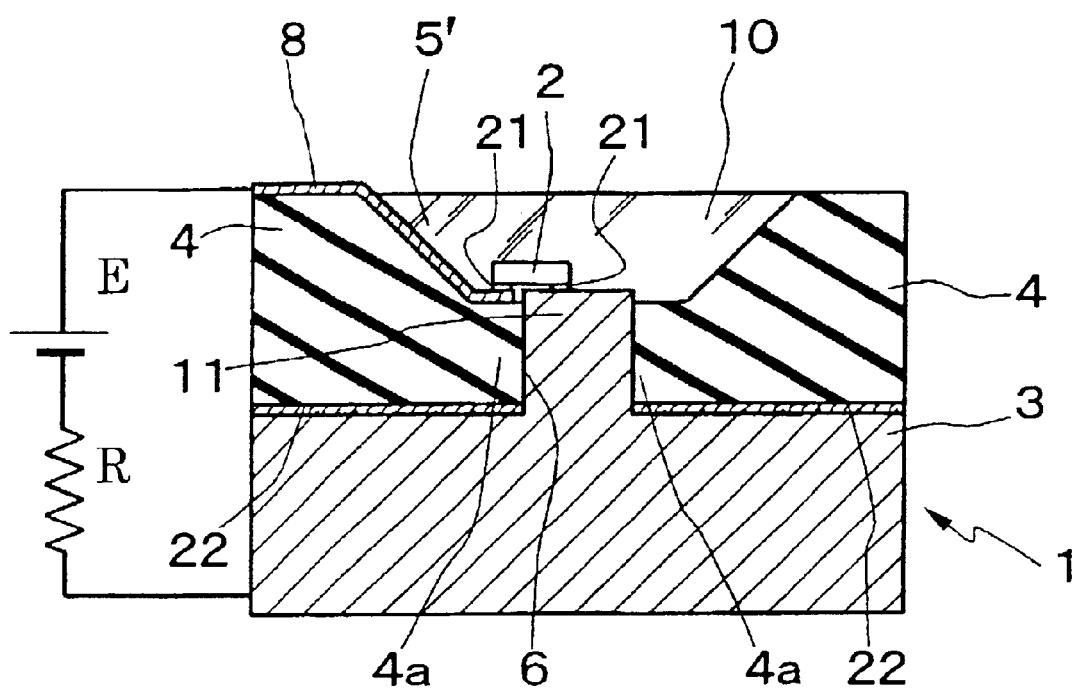
FIG. 9 is a cross sectional view of a light source apparatus showing Embodiment 9 of the present invention.

Embodiment 9 of the present invention will be described referring to FIG. 9. This embodiment is a modification of the light source apparatus of Embodiment 3 wherein the projection 11 of the radiator plate 3 made of an electrically conductive material such as copper is coated at the upper surface with a plating of gold. In addition, the wiring pattern 8 has a single electrode in the round recess 5' in the insulating member 4. The LED chip 2 is bridged between the projection 11 and the electrode of the wiring pattern 8 on the extension 4a. The LED chip 2 is electrically connected by a face down mounting technique at one of its two electrodes to the upper surface of the projection 11 and at the other to the electrode of the wiring pattern 8 on the extension 4a. As the other arrangement than the mounting of the LED chip 2 is identical to that of Embodiment 3, like components are denoted by like numerals and will be explained in no more detail.

As the LED chip 2 in the light source apparatus 1 of this embodiment similar to that of Embodiment 4 is mounted with its electrode facing the radiator plate 3, the light emitted from its light emitting layer is released through its transparent sapphire substrate. Accordingly, the light can hardly be interrupted by the electrodes of the LED chip 2 and thus declined in the intensity. As explained with Embodiment 3, the light emitted from the LED chip 2 can scarcely be absorbed by or randomly reflected on the tilted wall of the extension 4a, whereby the efficiency of light emission will be improved. Also, a direct current source E and a current controllable resistor R may preferably be connected between the wiring pattern 8 and the radiator plate 3 in this embodiment. This arrangement provides the supply of power to the LED chip 2 and allows the wiring pattern 8 to be minimized in the length at the round recess 5' because a part of the radiator plate 3 serves as a wiring line. As the radiator plate 3 permits a lead of the wiring pattern 8 to be drawn out to the back side, the light source apparatus 1 can be energized from the back side of the radiator plate 3. It would be understood that the direct current source E is replaced by any alternating current source when desired.

Although the LED chip 2 is mounted in the face down fashion in the light source apparatus 1 of this embodiment, it may be installed in a face up arrangement where its two electrodes are electrically connected by die bonding wires to the wiring pattern 8 and the radiator plate 3 respectively.

Embodiment 10

Figure 10:
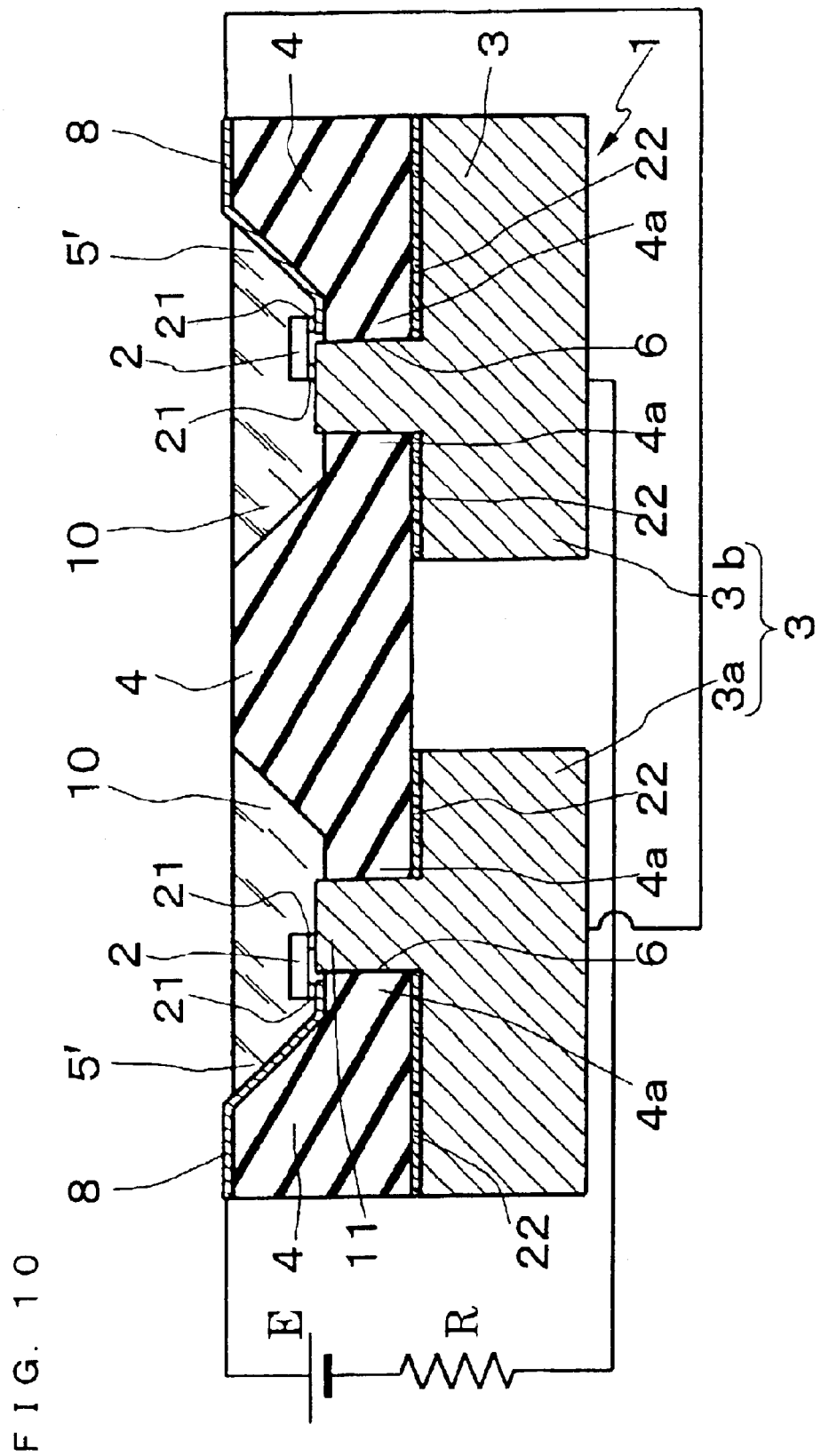
FIG. 10 is a cross sectional view of a light source apparatus showing Embodiment 10 of the present invention.

Embodiment 10 of the present invention will be described referring to FIG. 10. While the light source apparatus of Embodiment 9 includes the single LED chip 2 mounted on the radiator plate 3, this embodiment has two or more LED chips 2 (two illustrated) mounted on the radiator plate 3. Also, the radiator plate 3 is divided into a corresponding number of radiator plate segments 3a and 3b which are electrically isolated from each other. Each of the radiator plate segments 3a and 3b carries one LED chip 2. As the other arrangement is identical to that of Embodiment 9, like components are denoted by like numerals and will be explained in no more detail.

In the light source apparatus of Embodiment 9, the radiator plate 3 is made of an electrically conductive material and its potential is identical throughout the length. When two or more of the LED chips 2 are mounted on the radiator plate 3, they are electrically connected in parallel. The LED chips 2 are however slightly different in the driving voltage. As the LED chips 2 are connected in parallel, one of them which draws the least driving voltage may receive an excessive of the current and, if worse, be fractured. For supplying two or more of the LED chips 2 with a uniform current, each LED chip 2 may be connected in series with a current controlling resistor. Accordingly, the current controlling resistors are needed equal to the number of the LED chips 2 and their consumption of power will unfavorably be increased.

The radiator plate 3 of this embodiment is divided into the radiator plate segments 3a and 3b which are electrically isolated from each other, allowing each radiator plate segment 3 to carry one LED chip 2. Therefore, the LED chips 2 mounted on their respective radiator plate segments 3a and 3b are connected in series. The series connection of the LED chips 2 is then connected in series with a current controlling resistor R and a direct current source E. As the result, the LED chips 2 can be supplied with a uniform rate of the current. Accordingly, each LED chip 2 receives no excessive of the current and can be avoided from being fractured. As the single current controlling resistor R is connected to two or more of the LED chips 2, its power consumption can be minimized. The direct current source E may be a direct current converted from the output of an alternating current source.

The light source apparatus 1 of this embodiment similar to Embodiment 4 has the LED chip 2 arranged with its electrodes facing the radiator plate 3. This allows the light emitted from a light emitting layer of the LED chip 2 to be released from its sapphire substrate but not interrupted by the electrodes, hence avoiding any extra declination in the intensity of light output. Also, as described with Embodiment 3, the light emitted from the LED chip 2 can hardly be absorbed by or randomly reflected on the tilted side at the extension 4a of the insulating member 4, whereby the efficiency of light emission will be improved. Moreover, the source E and the current controlling resistor R are connected between the wiring pattern 8 and the radiator plate 3 in this embodiment, allowing the LED chip 2 to be energized through the radiator plate 3 used as a part of the feed line. Accordingly, the wiring pattern 8 in the round recess 5' can be minimized. As the radiator plate 3 permits a lead of the wiring pattern 8 to be drawn out to the back side, the light source apparatus 1 can be energized from the back side of the radiator plate 3.

Embodiment 11

Figure 11:
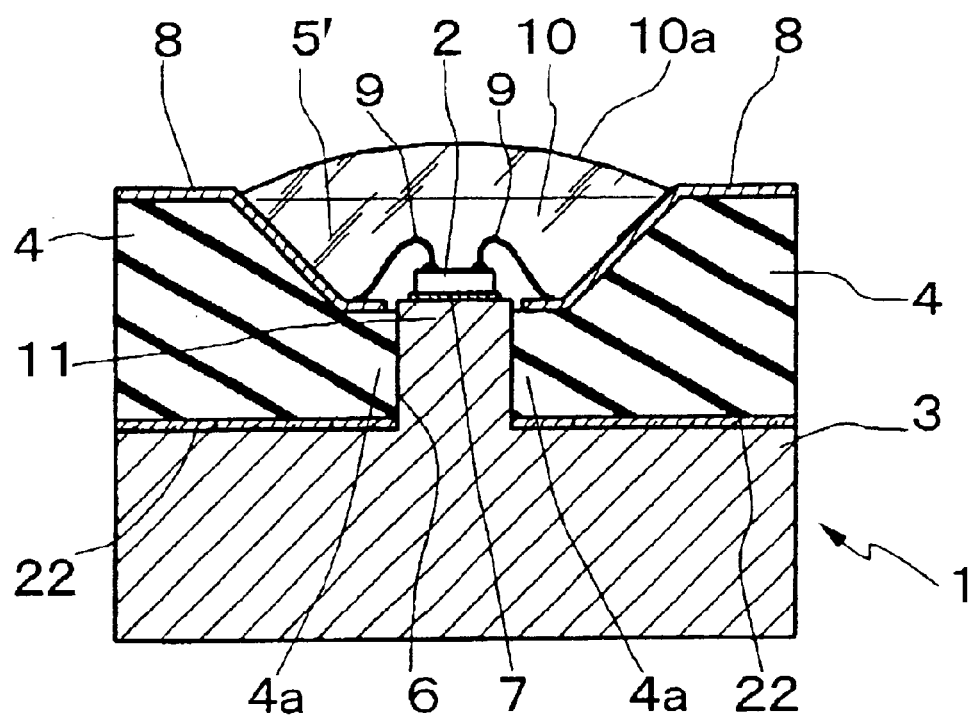
FIG. 11 is a cross sectional view of a light source apparatus showing Embodiment 11 of the present invention.

Embodiment 11 of the present invention will be described referring to FIG. 11. In the light source apparatus of Embodiment 3, the round recess 5' provided in the insulating member 4 is filled with the sealing resin (sealing material) 10 for encapsulating the LED chip 2 and the bonding wires 9. A light source apparatus 1 of this embodiment is adapted in which the application of a sealing resin 10 similar to that of Embodiment 3 is conducted by transfer forming with a set of molds to have a convex lens 10a shaped on the surface of the sealing resin 10. As the other arrangement than the sealing resin 10 is identical to that of Embodiment 3, like components are denoted by like numerals and will be explained in no more detail.

The filling with the sealing material in the light source apparatus of Embodiment 3 can hardly permit the sealing resin 10 to be configured to a desired shape. The light source apparatus 1 of this embodiment allows the sealing resin 10 to be poured under pressure into the molds (not shown) in which the radiator plate 3 and the insulating member 4 are installed in advance. This transfer forming technique facilitates to shape the convex lens 10a at the surface of the sealing resin 10. Accordingly, the light emitted from the LED chip 2 can successfully be directed in a desired forward direction by the effect of the convex lens of the sealing resin 10.

While the sealing resin 10 is shaped at the surface to a convex lens in this embodiment, it may be arranged to have a concave lens for dispersing the light. Also, the filling with the sealing material may be employed for having a desired shape of the sealing resin 10 through controlling the wet properties or affinity of the sealing resin 10 with the inside walls at the recess 5' of the insulating member 4 with respect to some given conditions including the roughness, the shape, and the surface finished state of the inside walls. Generally, when the wet properties are good, the surface of the sealing resin 10 will be concave. When not good, the surface of the sealing resin 10 will be convex.

Embodiment 12

Figure 12:
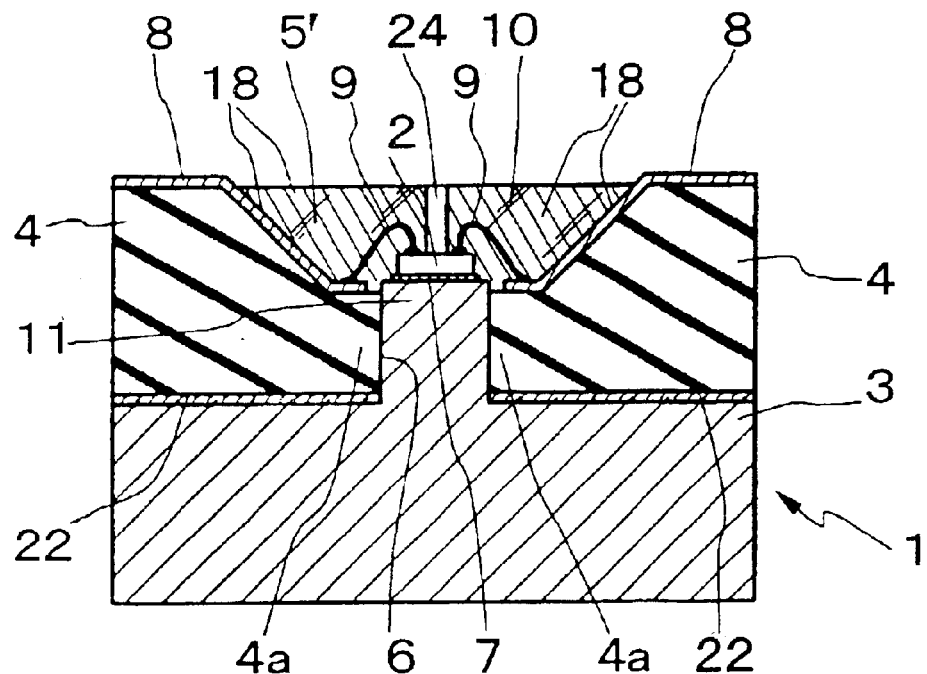
FIGS. 12a and 12b are a cross sectional view and a plan view of a light source apparatus showing Embodiment 12 of the present invention.
Figure 12:
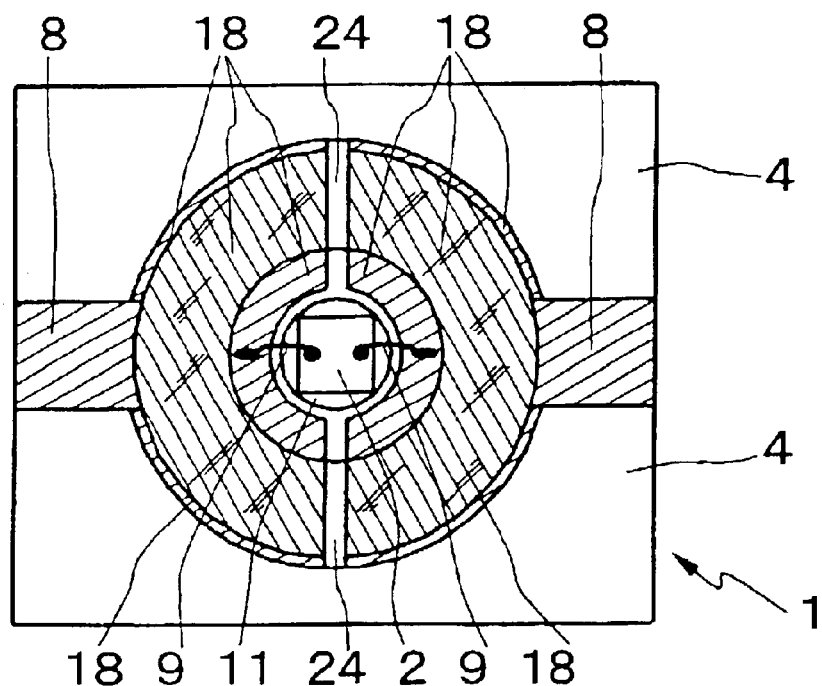

Embodiment 12 of the present invention will be described referring to FIGS. 12a and 12b. A light source apparatus 1 of this embodiment is adapted in which the inside walls at the round recess 5' of the insulating member 4 similar to those of Embodiment 3 are covered with highly reflective coatings (reflection surfaces) 18 of a highly electrical conductive material such as silver. The reflective coatings 18 are electrically isolated from each other by a narrow slit 24 (of 0.2 mm wide, for example) which extends at a right angle to the direction of the wiring pattern 8 but electrically connected to both ends of the wiring pattern 8. The two electrodes of the LED chip 2 mounted on the projection 11 are electrically joined by the bonding wires 9 to the two reflective coatings 18 respectively. As the other arrangement than the reflective coatings 18 is identical to that of Embodiment 3, like components are denoted by like numerals and will be explained in no more detail.

The light source apparatus 1 of this embodiment allows the light emitted from the LED chip 2 to be mostly forwarded through the sealing resin 10 and partially reflected on the reflective coatings 18 before directed to the front. As the reflective coatings 18 are higher in the reflectivity than the insulating material 4, the output of light emission will significantly increase as compared with the light source apparatus of Embodiment 3. Also, the reflective coatings 18 in the light source apparatus 1 of this embodiment partially serve as the leads of the wiring pattern 8, hence permitting the wiring pattern 8 to be simplified in the configuration at the round recess 5' as compared with the wiring pattern 8 arranged separately of the reflective coatings 18 in the round recess 5'. The reflective coatings 18 may be made of gold for ease of the connection of the bonding wires 9. Because the gold of the reflective coatings 18 possibly absorbs a blue component of the light emitted from the LED chip 2, the reflective coatings 18 of this embodiment are preferably made of silver.

Embodiment 13

Figure 13A:
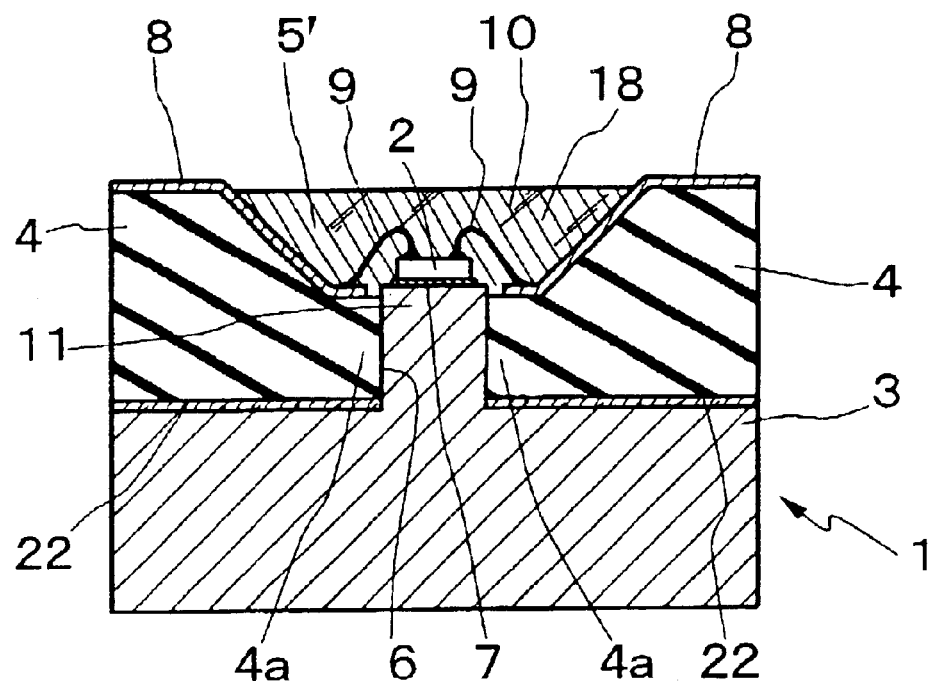
FIGS. 13a and 13b are a cross sectional view and a plan view of a light source apparatus showing Embodiment 13 of the present invention.
Figure 13B:
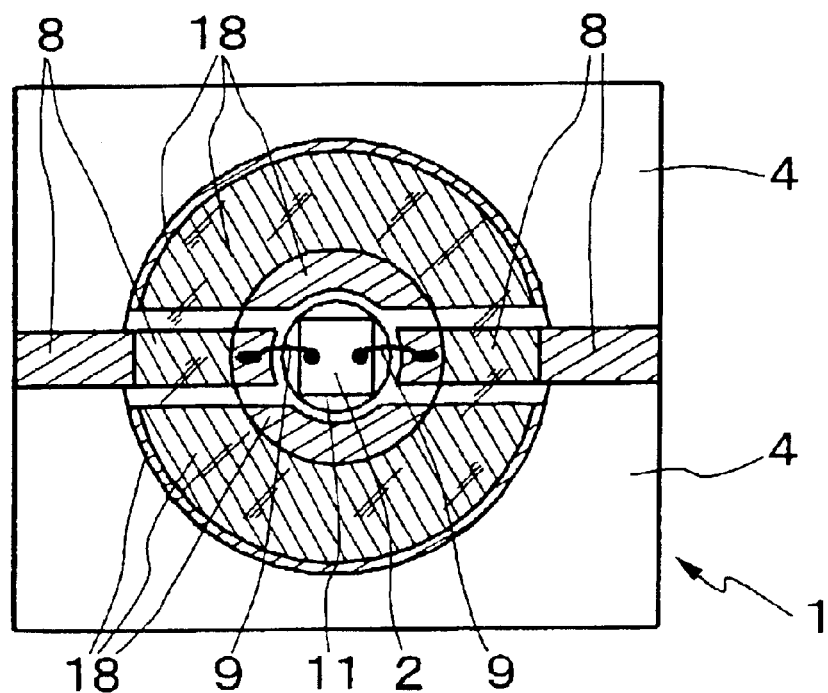

Embodiment 13 of the present invention will be described referring to FIGS. 13a and 13b. In the light source apparatus of Embodiment 3, the wiring pattern 8 having a width substantially equal to the diameter of the projection 11 is arranged to extend linearly across the projection 11 on the upper side of the insulating member 4 opposite to the radiator plate 3 side and electrically connected by the bonding wires 9 to the electrodes of the LED chip 2. A light source apparatus 1 of this embodiment has the wiring pattern 8 arranged to have a width (about 0.5 mm, for example) smaller than the diameter of the projection 11. Both ends of the wiring pattern 8 at the recess 5' are extended longer along the direction of the bonding wires 9 which electrically connect between the two electrodes of the LED chip 2 and the two ends of the wiring pattern 8 respectively. The other area of the inside walls than the wiring pattern 8 provided area at the recess 5' of the insulating member 4 are covered with a couple of highly reflective coatings (reflection surfaces) 18 made of e.g. silver. As the other arrangement than the wiring pattern 8 and the reflective coatings 18 is identical to that of Embodiment 3, like components are denoted by like numerals and will be explained in no more detail.

The light source apparatus 1 of this embodiment allows the light emitted from the LED chip 2 to be mostly forwarded through the sealing resin 10 and partially reflected on the reflective coatings 18 before directed to the front.

In the light source apparatus of Embodiment 3, the light emitted from the LED chip 2 is partially interrupted by the bonding wires 9. Also, the wiring pattern 8 provided in the recess 5' are gold plated for ease of the wire bonding. The gold plating is however low in the reflectivity of blue or green color light to be emitted from the LED chip 2. This will decline the output of light emission of the LED chip 2.

The wiring pattern 8 in this embodiment which exhibits a lower level of the reflectivity is minimized in the width and extended along the direction of the bonding wires 9. As the shades created by the bonding wires 9 overlap with the wiring pattern 8, the light emitted from the LED chip 2 can be interrupted at minimum. Also, the other area at the recess 5' of the insulating member 4 than the wiring pattern 8 is covered with the reflective coatings 18 and the light emitted from the LED chip 2 can partially be reflected on the reflective coatings 18 thus improving the efficiency of light pickup.

Embodiment 14

Figure 14:
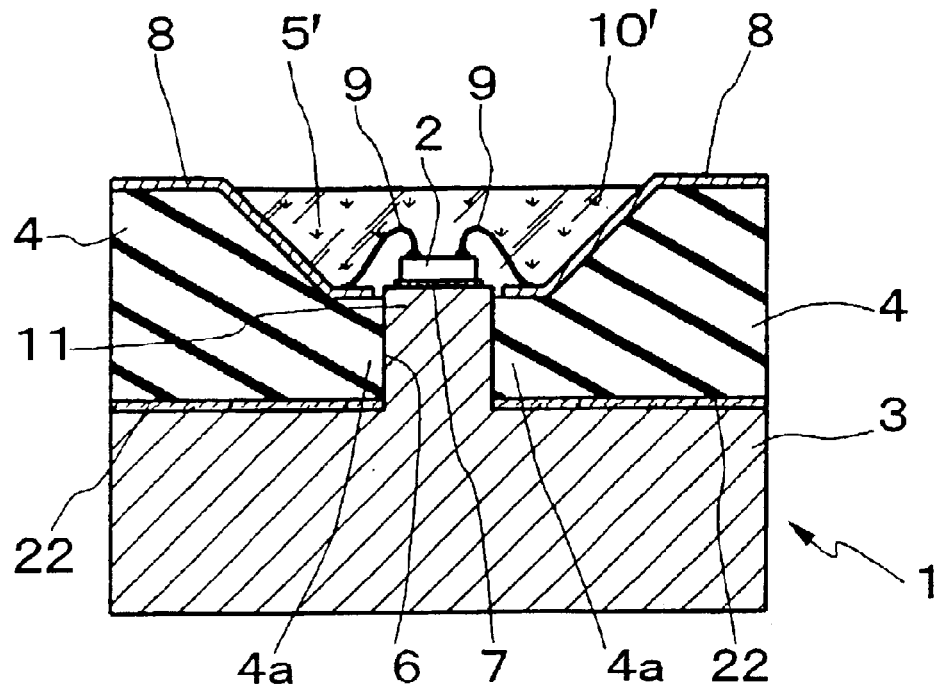
FIG. 14 is a cross sectional view of a light source apparatus showing Embodiment 14 of the present invention.

Embodiment 14 of the present invention will be described referring to FIG. 14. A light source apparatus 1 of this embodiment is adapted in which with the LED chip 2 of blue color light emission type similar to that of Embodiment 3, a sealing resin (material) 10' is provided having fluorescent particles dispersed therein for developing yellow color light which is complementary to the blue color light. As the result, the sealing resin 10' has a function of light color conversion. As the other arrangement than the sealing resin 10' is identical to that of Embodiment 3, like components are denoted by like numerals and will be explained in no more detail.

The light source apparatus 1 of this embodiment allows the blue color light emitted from the LED chip 2 to be turned to a white color light by the action of the fluorescent particles providing a yellow color light to be combined. The conventional bullet shaped LED lamp lasts as short as 6000 hours before the intensity of light flux is declined to 70% of the initial level. The light source apparatus 1 of this embodiment having the LED chip 2 improved in the effect of heat radiation can be longer in the operating life than the conventional bullet shaped LED lamp, hence successfully acting as a white light emission diode increased in the operating life.

Embodiment 15

Figure 15:
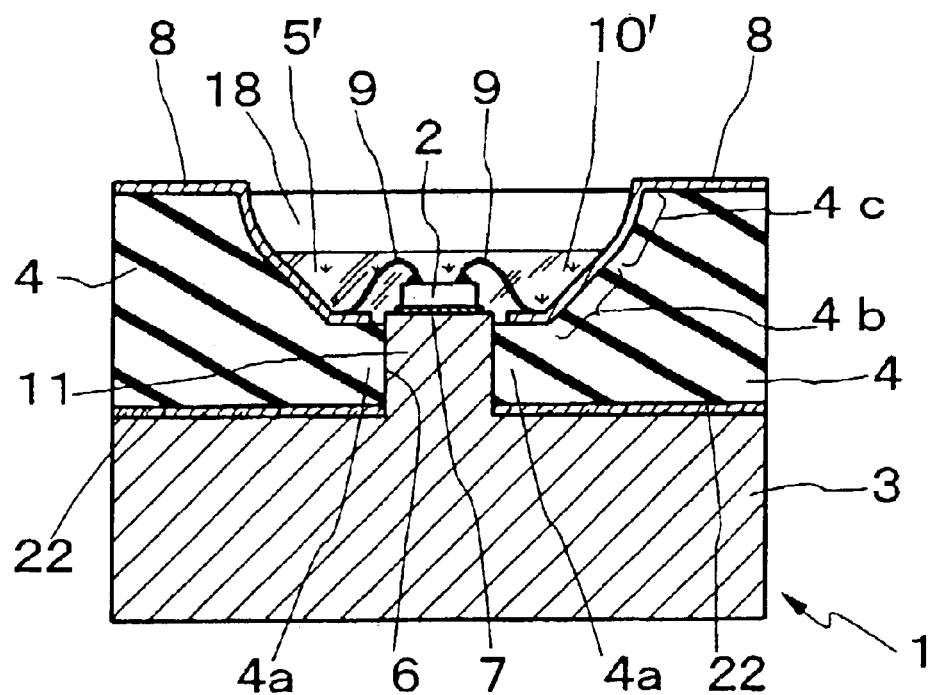
FIG. 15 is a cross sectional view of a light source apparatus showing Embodiment 15 of the present invention.

Embodiment 15 of the present invention will be described referring to FIG. 15. A light source apparatus 1 of this embodiment is adapted in which a round recess 5' similar to that of Embodiment 14 has a two-step construction. More particularly, the cross section at the recess 5' of the insulating member 4 has a tilted side 4b provided, as the first step, at an angle of about 45 degrees where the diameter of the recess 5' becomes greater towards the opening. It also has a reflective side 4c, as the second step, provided extending from the tilted side 4b to the opening of the recess 5' for reflecting the light emitted from the LED chip 2 in desired directions. In addition, the wiring pattern 8 is extended linearly across the projection 11 along the upper side of the insulating member 4 opposite to the radiator plate 3 side. The other area than the wiring pattern 8 provided area at the recess 5' of the reflective side 4c of the insulating member 4 is covered with a reflective coating 18 made of a highly reflective material such as silver. The recess 5' is filled with the sealing resin 10' up to the uppermost of the tilted side 4b. As the other arrangement than the inside wall at the recess 5' of the insulating member 4 is identical to that of Embodiment 14, like components are denoted by like numerals and will be explained in no more detail.

The light source apparatus 1 of this embodiment allows the light released from the first step of the recess 5' to be fully diffused by the effect of the fluorescent particles contained in the sealing resin 10'. As the light released from the first step of the recess 5' is easily controlled, the overall output of light emission from the LED chip 2 can favorably be forwarded in a desired direction by modifying the shape of the reflective side 4c as the second step.

Embodiment 16

Figure 16:
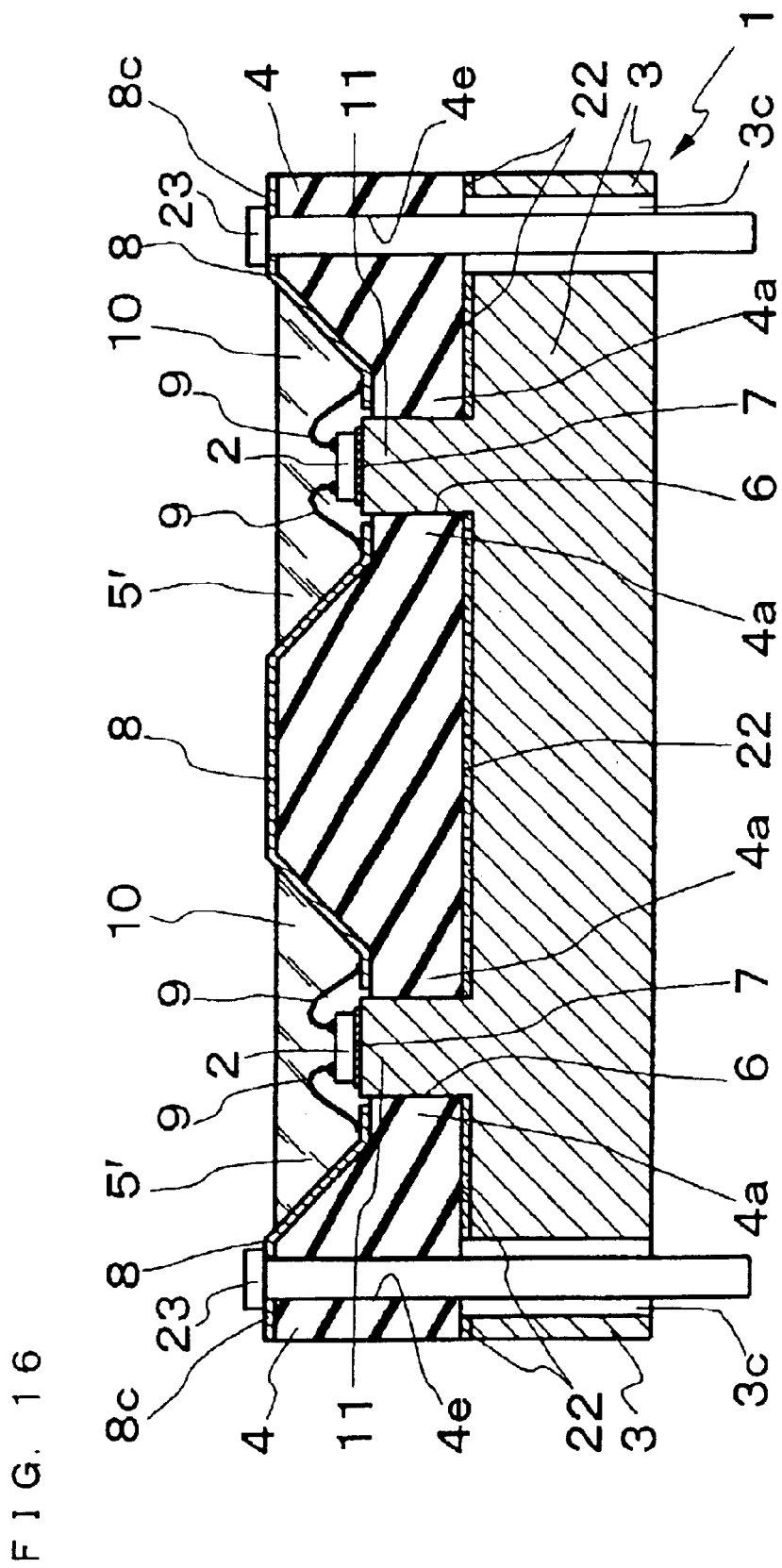
FIG. 16 is a cross sectional view of a light source apparatus showing Embodiment 16 of the present invention.

Embodiment 16 of the present invention will be described referring to FIG. 16. A light source apparatus 1 of this embodiment is similar in the construction to that of Embodiment 3. While the single LED chip 2 is mounted on the radiator plate 3 in Embodiment 3, two LED chips 2 are installed on the radiator plate 3 in this embodiment. The two LED chips 2 are electrically connected in series with each other via the wiring pattern 8. As the other arrangement of the light source apparatus 1 of this embodiment is identical to that of Embodiment 3, like components are denoted by like numerals and will be explained in no more detail.

For improvement of a light source apparatus, it is generally desired to minimize the size of the other components than the light emitting section. In the light source apparatus of Embodiment 3, a specific region of the wiring pattern 8 provided on the upper side of the insulating member 4 for connecting to an external source is situated at the light pickup side and its relevant component such as a connector stays on the light pickup (emitting) side of the light source apparatus 1. It is hence necessary to increase the installation area for holding the relevant component other than the light emitting area.

The light source apparatus 1 of this embodiment has a through bore 3c provided in each end of the radiator plate 3 and a through hole 4e provided in each end of the insulating member 4 to communicate at one end with the through bore 3c and at the other end to a flat region 8c of the wiring pattern 8 which is electrically connected at the other end to the LED chip 2 and disposed on the upper (front) side of the insulating member 4 while the insulating member 4 is separated into three segments by the two LED chips 2. An electrode pin 23 made of a substantially rod-like electrically conductive material is inserted from the above into the through hole 4e in the insulating member 4 and the through bore 3c in the radiator plate 3 until its distal end projects from each end of the lower side of the radiator plate 3. The light source apparatus 1 can thus be anchored with the two electrode pins 23 fixedly retained to a stationary member and electrically connected to the wiring pattern 8. It is noted that the through hole 4e is smaller in the inner diameter than the through bore 3c.

As explained, the wiring pattern 8 is electrically joined at both ends to the two electrode pins 23 which extend through the radiator plate 3. As the other (distal) ends of the electrode pins 23 extending to the radiator plate 3 serve as a pair of external connector terminals, the two LED chips 2 can be energized from the radiator plate 3 side. This permits the relevant component such as a connector to be located on the radiator plate 3 side (opposite to the upper or light emitting side), hence minimizing the other area than the light emitting section area at the light pickup side and decreasing the overall size of the light source apparatus 1. With the size remaining unchanged, the output of light emission can be increased.

Embodiment 17

Embodiment 17 of the present invention will be described referring to FIG. 17. A light source apparatus 1 of this embodiment is adapted in which the radiator plate 3 similar to that of Embodiment 3 is modified to substantially a round column form of about 5 mm in the diameter and about 10 mm in the height excluding the projection 11. The radiator plate 3 has the projection 11 provided upright on substantially a center region of the upper side thereof. Also, the insulating member 4 is arranged of a square shape having each side of about 10 mm long. The wiring pattern 8 is extended from the upper or front side via both sides to the back side of the insulating member 4 and its two ends are defined as external connector terminals 8d on the back side. As the other arrangement than the radiator plate 3 and the wiring pattern 8 is identical to that of Embodiment 3, like components are denoted by like numerals and will be explained in no more detail.

Figure 17:
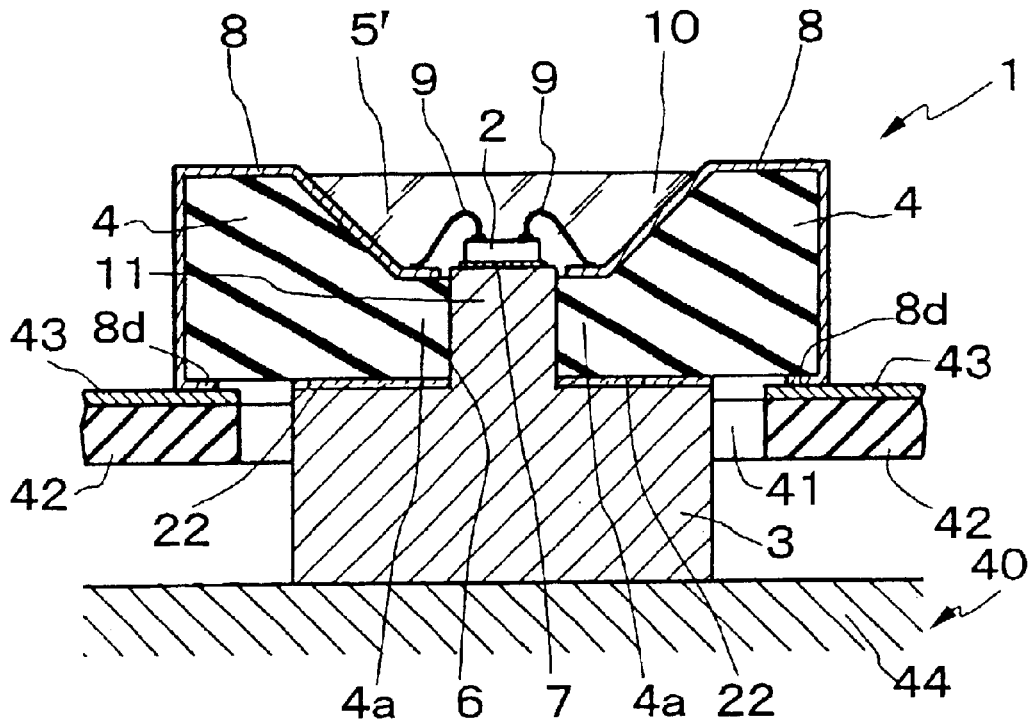
FIG. 17 is a cross sectional view of a light source apparatus showing Embodiment 17 of the present invention.

The light source apparatus 1 shown in FIG. 17 is anchored to a main system 40. The main system 40 includes a glass epoxy circuit board 42 having a round opening 41 of about 6 mm in diameter. As the radiator plate 3 of the light source apparatus 1 is accommodated in the round opening 41 of the circuit board 42, the external connector terminals 8d provided on the back side of the insulating member 4 are soldered to corresponding terminals 43 provided on the circuit board 42, thus joining the light source apparatus 1 to the main system 40 electrically and mechanically. Simultaneously, the radiator plate 3 is thermally coupled at the back side which projects downwardly through the round opening 41 to a radiating member 44 of the main system 40, hence increasing the effect of heat radiation of the light source apparatus 1. As the back or lower side of the radiator plate 3 is coupled directly to the radiating member 44 provided separately of the circuit board 42, the heat propagated from the LED chip 2 can favorably be dissipated from the radiating member 44. Accordingly, the circuit board 42 can be constructed from a glass epoxy material which is low in the thermal conductivity but advantageous in the price, thus declining the overall cost.

Although the radiator plate 3 of this embodiment carries the single LED chip 2, it may hold two or more LED chips 2.

Embodiment 18

Embodiment 18 of the present invention will be described referring to FIG. 18. The radiator plate 3 of the light source apparatus of Embodiment 3 is modified to substantially a round column form of about 5 mm in the diameter and about 0.5 mm in the height excluding the projection 11. The radiator plate 3 has the projection 11 provided upright on substantially a center of the upper side thereof. Also, the insulating member 4 is arranged of a square shape having each side of about 20 mm long and has a back recess 27 of about 5 mm in diameter and about 0.5 mm in depth provided about the through hole 6 in the radiator plate 3 side thereof. A through hole 28 is provided in each end of the insulating member 4 outwardly of the back recess 27 to communicate with one end of the wiring pattern 8 provided on the upper side of the insulating member 4. The through hole 28 is filled with the same electrically conductive material as of the wiring pattern 8 which forms a conductor 8e by which the wiring pattern 8 on the upper or front side of the insulating member 4 is electrically connected to an external connector terminal 8f provided on the back side of the same. As the other arrangement than the radiator plate 3, the insulating member 4, and the wiring pattern 8 is identical to that of Embodiment 3, like components are denoted by like numerals and will be explained in no more detail.

Figure 18:
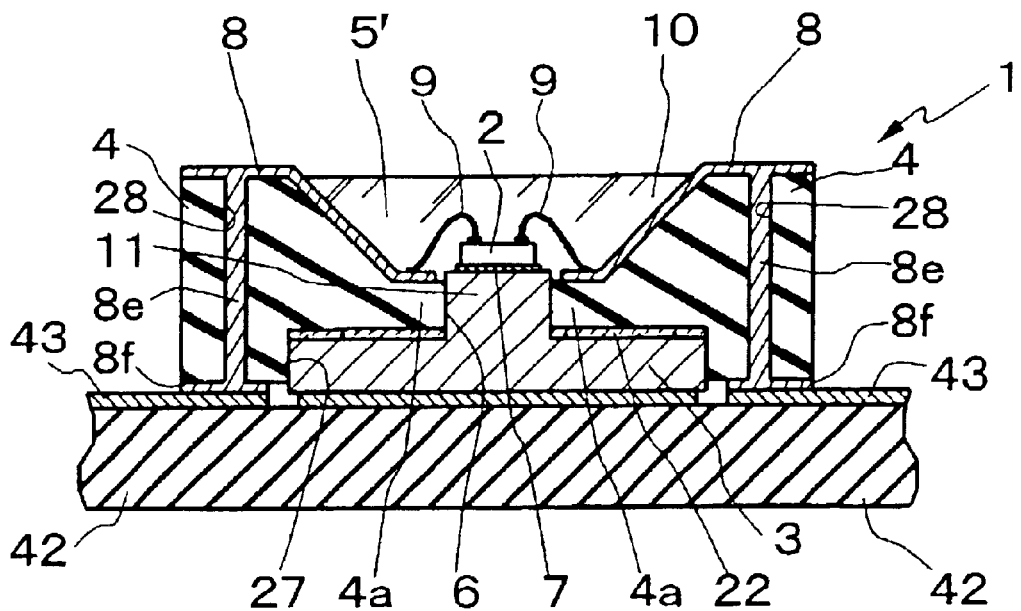
FIG. 18 is a cross sectional view of a light source apparatus showing Embodiment 18 of the present invention.

The light source apparatus 1 of this embodiment shown in FIG. 18 is mounted on a circuit board 42 of a main system. The dimensions are determined so that the lower side of the radiator plate 3 is flush with the lower side of the insulating member 4. With the radiator plate 3 mounted on the circuit board 42, the externals connector terminals 8f provided on the insulating member 4 are electrically connected to corresponding terminals 43 of the circuit board 42. Accordingly, the LED chip 2 can directly be energized from the circuit board 42. As the result, the light source apparatus 1 is directly mounted and connected to a corresponding wiring pattern of the circuit board 42. Also, as the radiator plate 3 is seated directly on the circuit board 42, the heat can directly be transferred from the light source apparatus 1 to the circuit board 42. Accordingly, the light source apparatus 1 of a surface mount type can be improved in the effect of heat radiation.

Although the radiator plate 3 of this embodiment carries the single LED chip 2, it may hold two or more LED chips 2.

Embodiment 19

Figure 19:
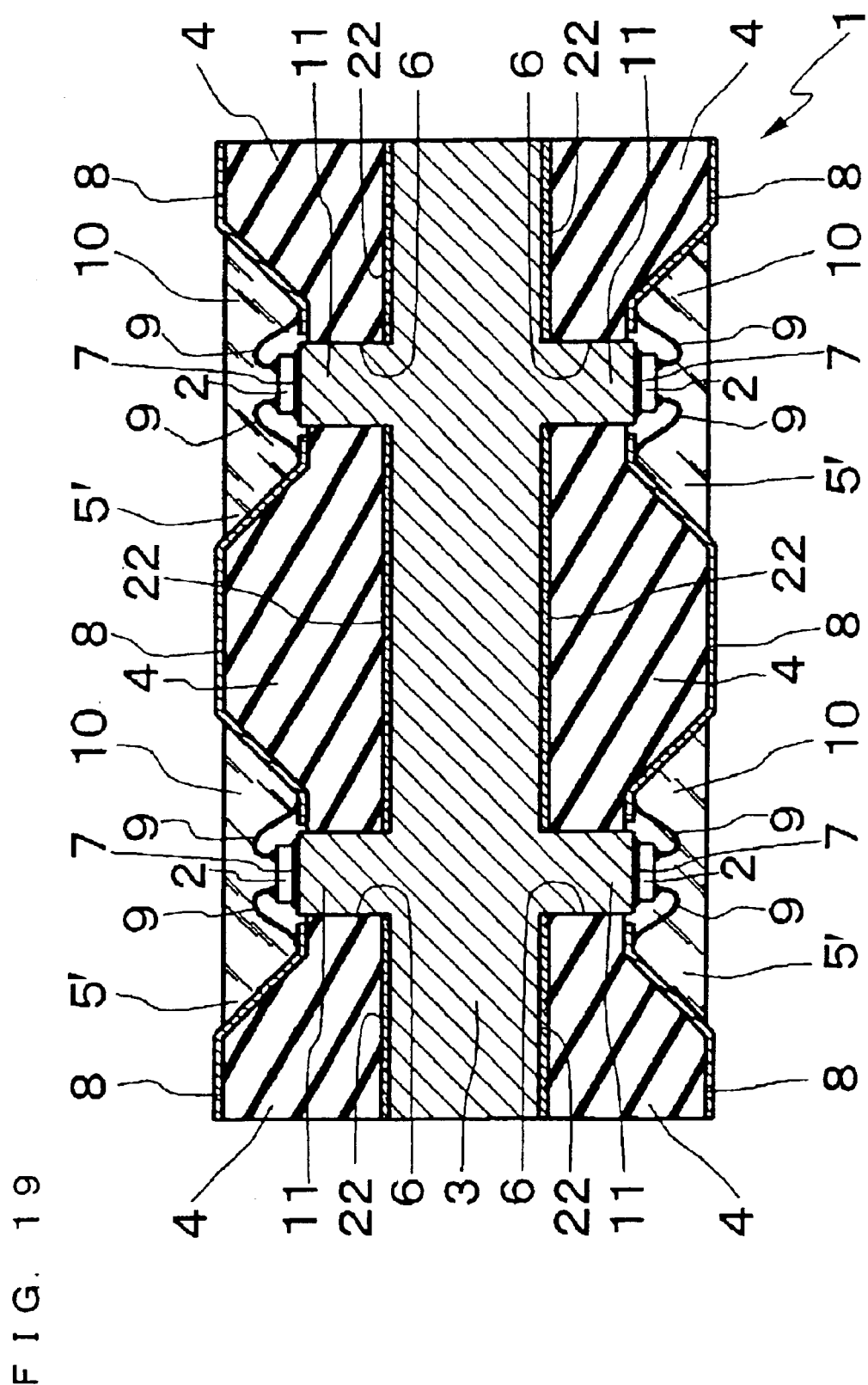
FIG. 19 is a cross sectional view of a light source apparatus showing Embodiment 19 of the present invention.
Figure 20:
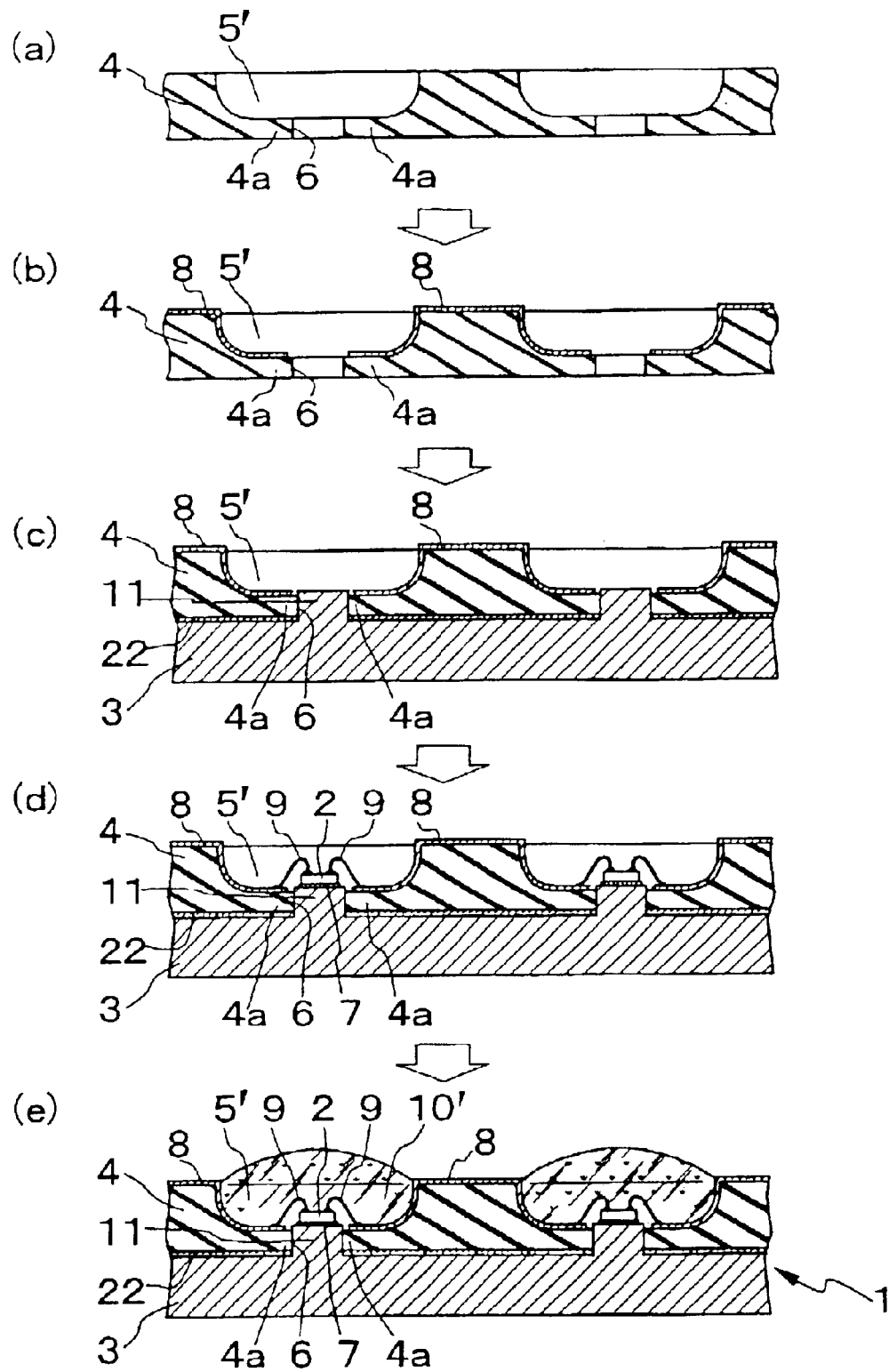
FIGS. 20a to 20e are cross sectional views of steps of a light source apparatus producing method showing Embodiment 20 of the present invention.
Figure 21:
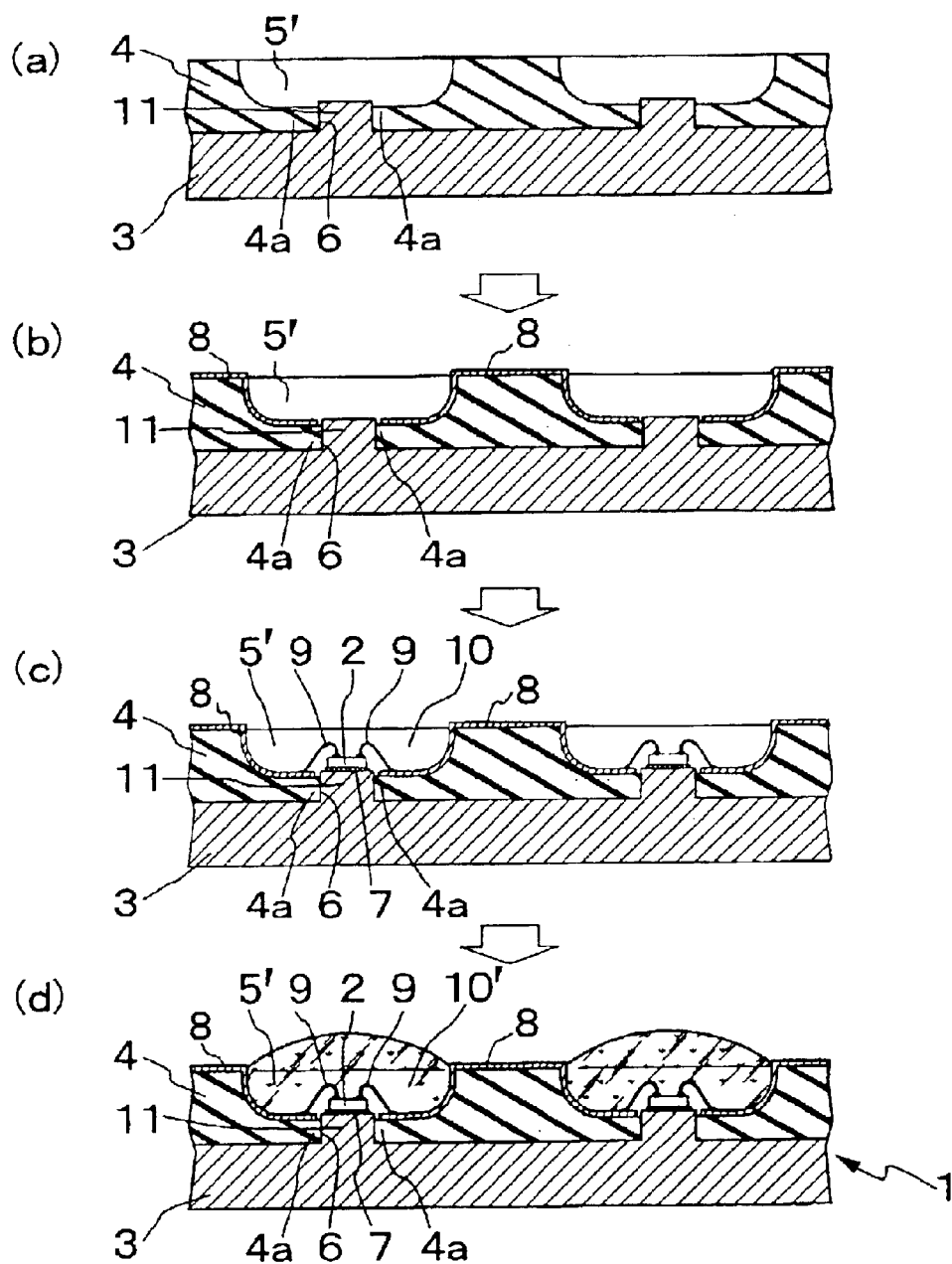
FIGS. 21a to 21d are cross sectional views of steps of a light source apparatus producing method showing Embodiment 21 of the present invention.

Embodiment 19 of the present invention will be described referring to FIG. 19. While the radiator plate 3 in the light source apparatus of Embodiment 3 carries one LED chip 2 on one side thereof, the radiator plate 3 in a light source apparatus 1 of this embodiment has two LED chips 2 mounted on both sides thereof respectively. As the other arrangement than the two LED chips 2 on the radiator plate 3 is identical to that of Embodiment 3, like components are denoted by like numerals and will be explained in no more detail.

The light source apparatus 1 has two projections 11 provided on both sides of its radiator plate 3. Each of the two insulating members 4 has recesses 5' provided in the opposite side to the radiator plate 3 thereof to correspond to each projection 11. The insulating member 4 also has through holes 6 therein provided at the bottom of their respective recesses 5'. The inner diameter of the through hole 6 is about 1 mm which is substantially equal to the outer diameter of the projection 11. The inner diameter of the recess 5' is about 2 mm at the bottom and becomes gradually greater as departing from the radiator plate 3 so that the side wall at the recess 5' of the insulating member 4 is tilted at about 45 degrees in the cross section.

The two insulating members 4 are bonded to both sides of the radiator plate 3 with their through holes 6 closely accepting the projections 11. The LED chip 2 of about 0.2 mm thick is die bonded by a die bonding paste 7, such as silver paste, to the upper surface of each projection 11 exposed from the through hole 6. The wiring pattern 8 is provided on the opposite side to the radiator plate 3 of the insulating member 4 and coated at the surface with a gold plating. The wiring pattern 8 is extended to the side wall and the bottom at the recess 5' of the insulating member 4. Then, each end of the wiring pattern 8 provided on the extension 4a at the bottom of the recess 5' of the insulating member 4 is electrically connected by a bonding wire 9 of a metal lead, such as a gold, to the corresponding electrode of the LED chip 2.

As described, the light source apparatus 1 of this embodiment has a combination of the insulating member 4, the LED chip 2, the wiring pattern 8, and the sealing resin 10 provided on each side of the radiator plate 3, hence allowing the light of the LED chips 2 to be emitted from both sides of the radiator plate 3. Also, the radiator plate 3 has two equal combinations of the components mounted on both sides thereof and can thus be prevented from deflection.

Embodiment 20

A method of producing the light source apparatus with an MID (molded interconnect device) according to Embodiment 20 of the present invention will be described step by step referring to FIGS. 20a to 20e. As the arrangement of the light source apparatus 1 is identical to that of Embodiment 3, like components are denoted by like numerals and will be explained in no more detail.

The method starts with a first step of shaping the insulating material 4. The insulating member 4 may be made of liquid crystal polymer, polyphthalamide, polyphthalsulfone, epoxy, syndiotactic polystyrene (SPS), or polybutylene terephthalate (PBT). The recesses 5' and the through holes 6 are configured by injection molding or transfer forming (See FIG. 20a). The insulating material is not limited to the foregoing polymers but may be selected from any other inorganic materials, such as alumina or zirconium, compounded with an (organic) binder, subjected to injection molding, degreased (to remove organic materials), and baked.

A second step then follows for providing the wiring pattern 8. More specifically, a thin copper base layer of 0.3 μm thick is first deposited by vacuum vapor deposition, DC sputtering, or RF sputtering on one side of the insulating member 4. Then, the thin copper base layer on the radiator plate 3 is exposed to an electromagnetic wave, such as laser beam, to remove unwanted regions of the base layer. More specifically, the laser beam may preferably be YAG laser which can easily be absorbed by the base layer. For example, the laser beam is irradiated to the other insulating regions (referred to as non-circuit regions hereinafter) than the (wiring) circuit pattern 8 by scanning with a galvanomirror. The laser beam is scanned at least along the non-circuit regions at the edge of the circuit pattern to remove the base layer of the non-circuit regions. Then, the circuit pattern is energized for electrolytic copper plating, electrolytic nickel plating, or electrolytic silver plating to develop a patterned metal layer of a desired thickness. After the non-circuit regions are cleared off by e.g. soft etching, a desired thickness metal layer of the wiring pattern 8 is completed (See FIG. 20b). The electrolytic silver plating may be replaced by electrolytic gold plating. The material and the thickness of the plating can preferably be determined depending on the efficiency of light reflection and the labor of wiring process.

This is followed by a third step for providing and joining the radiator plate 3 to the insulating member 4. The radiator plate 3 is prepared from a highly thermal conductive material, such as aluminum, silver, or copper, and bonded to the lower side of the insulating member 4 by an adhesive 22 such as epoxy resin or acrylic resin (See FIG. 20c). Preferably, the projection 11 is preliminarily developed on a region of the radiator plate 3 to correspond to the through hole 6 in the insulating member 4. Also, the joining between the radiator plate 3 and the insulating member 4 may be carried out by fitting the projection 11 into the corresponding through hole 6.

A fourth step follows for die bonding and electrical connection. The blue color LED chip 2 is die bonded by a transparent adhesive to an exposed region of the radiator plate 3 projected from the through hole 6 in the insulating member 4 and electrically connected to the wire pattern 8 by wire bonding with bonding wires 9 which may preferably be 25 μm thick gold wires (See FIG. 20d).

Finally, a fifth step is carried out for sealing. The recess 5' is filled with the sealing resin (material) 10' which contains fluorescent particles dispersed into a resin base and excited by blue color light emitted from the LED chip 2 for complementing the blue color light with yellow color light. As the result, the LED chip 2 and the bonding wires 9 are encapsulated in the sealing resin 10' (See FIG. 20e).

In the conventional light source apparatus, the insulating member is shaped by machining prior to the mounting of the LED chip 2 and will hardly be low in the processing cost. Also, the LED chip 2 mounting surface of the insulating member may easily be injured or roughened hence making the installation process difficult. According to the method of this embodiment, when the radiator plate 3 has been bonded to the insulating member 4, its exposed region projected from the through hole 6 in the insulating member 4 is provided with the LED chip 2 and the cost of the step can be declined. While the LED chip 2 mounting surface is flat and insulated, the pads of the wiring pattern 8 for connection to the bonding wires 9 are flat and smooth. Accordingly, the installation of the LED chip 2 can easily be conducted. As the bonding wires 9 remain disposed in the recess 5' of the insulating member 4, it can hardly be exposed from the sealing resin 10' with which the recess 5' is filled up and its injury will be minimized in the probability thus contributing to the operational reliability of the apparatus.

Embodiment 21

A method of producing the light source apparatus according to Embodiment 21 of the present invention will be described step by step referring to FIGS. 21a to 21d. As the arrangement of the light source apparatus 1 is identical to that of Embodiment 3, like components are denoted by like numerals and will be explained in no more detail.

The method starts with a first step of insert forming to prepare the insulating member 4 coupled to the radiator plate 3. The insulating member 4 may be made of liquid crystal polymer, polyphthalamide, polyphthalsulfone, epoxy, SPS, or PBT. The radiator plate 3 may be made of a highly thermal conductive material such as silver, aluminum, or copper. The radiator plate 3 and the insulating member 4 are shaped at once by insert forming (See FIG. 21a).

A second step then follows for providing the wiring pattern 8. More specifically, a thin copper base layer of 0.3 μm thick is first deposited by vacuum vapor deposition, DC sputtering, or RF sputtering on the exposed side of the insulating member 4. Then, the thin copper base layer on the radiator plate 3 is exposed to an electromagnetic wave, such as laser beam, to remove unwanted regions of the base layer. More specifically, the laser beam may preferably be YAG laser which can easily be absorbed by the base layer. For example, the laser beam is irradiated to the other insulating regions (referred to as non-circuit regions hereinafter) than the (wiring) circuit pattern 8 by scanning with a galvanomirror. The laser beam is scanned at least along the non-circuit regions at the edge of the circuit pattern to remove the base layer of the non-circuit regions. Then, the circuit pattern is energized for electrolytic copper plating, electrolytic nickel plating, or electrolytic silver plating to develop a patterned metal layer of a desired thickness. After the non-circuit regions are cleared off by e.g. soft etching, a desired thickness metal layer of the wiring pattern 8 is completed (See FIG. 21b). The electrolytic silver plating may be replaced by electrolytic gold plating. The material and the thickness of the plating can preferably be determined depending on the efficiency of light reflection and the labor of wiring process.

This is followed by a third step for die bonding and electrical connection. The blue color LED chip 2 is die bonded by a transparent adhesive to an exposed region of the radiator plate 3 projected from the through hole 6 in the insulating member 4 and electrically connected to the wire pattern 8 by wire bonding with bonding wires 9 which may preferably be 25 μm thick gold wires (See FIG. 21c).

Finally, a fourth step is carried out for sealing. The recess 5' is filled with the sealing resin (material) 10' which contains fluorescent particles dispersed into a resin base and excited by the blue light emitted from the LED chip 2 for complementing the blue color light with yellow color light. As the result, the LED chip 2 and the bonding wires 9 are encapsulated in the sealing resin 10' (See FIG. 21d).

In the conventional light source apparatus, the insulating member is shaped by machining prior to the mounting of the LED chip 2 and will hardly be low in the processing cost. Also, the LED chip 2 mounting region of the insulating member may easily be injured or roughened hence making the installation of the LED chip 2 difficult. According to the method of this embodiment, the radiator plate 3 and the insulating member 4 are shaped at once by insert forming and then the LED chip 2 is mounted to the exposed region of the radiator plate 3 projected from the through hole. 6 in the insulating member 4. This allows the LED chip 2 installation region of the radiator plate 3 to be planar while the insulating member 4 incorporates an MID of which the pads for connection with the bonding wires 9 are flat and smooth. Accordingly, the installation of the LED chip 2 can easily be conducted. As the bonding wires 9 remain disposed in the recess 5' of the insulating member 4, it can hardly be exposed from the sealing resin 10' with which the recess 5' is filled up and its injury will be minimized in the probability thus contributing to the operational reliability of the apparatus. In addition, as the radiator plate 3 and the insulating member 4 are shaped at once by insert forming, the step of joining the two components can be eliminated and the overall production cost will be minimized.

Embodiment 22

A method of producing the light source apparatus according to Embodiment 22 of the present invention will be described step by step referring to FIGS. 22a to 22d. As the arrangement of the light source apparatus 1 is identical to that of Embodiment 3, like components are denoted by like numerals and will be explained in no more detail.

Figure 22:
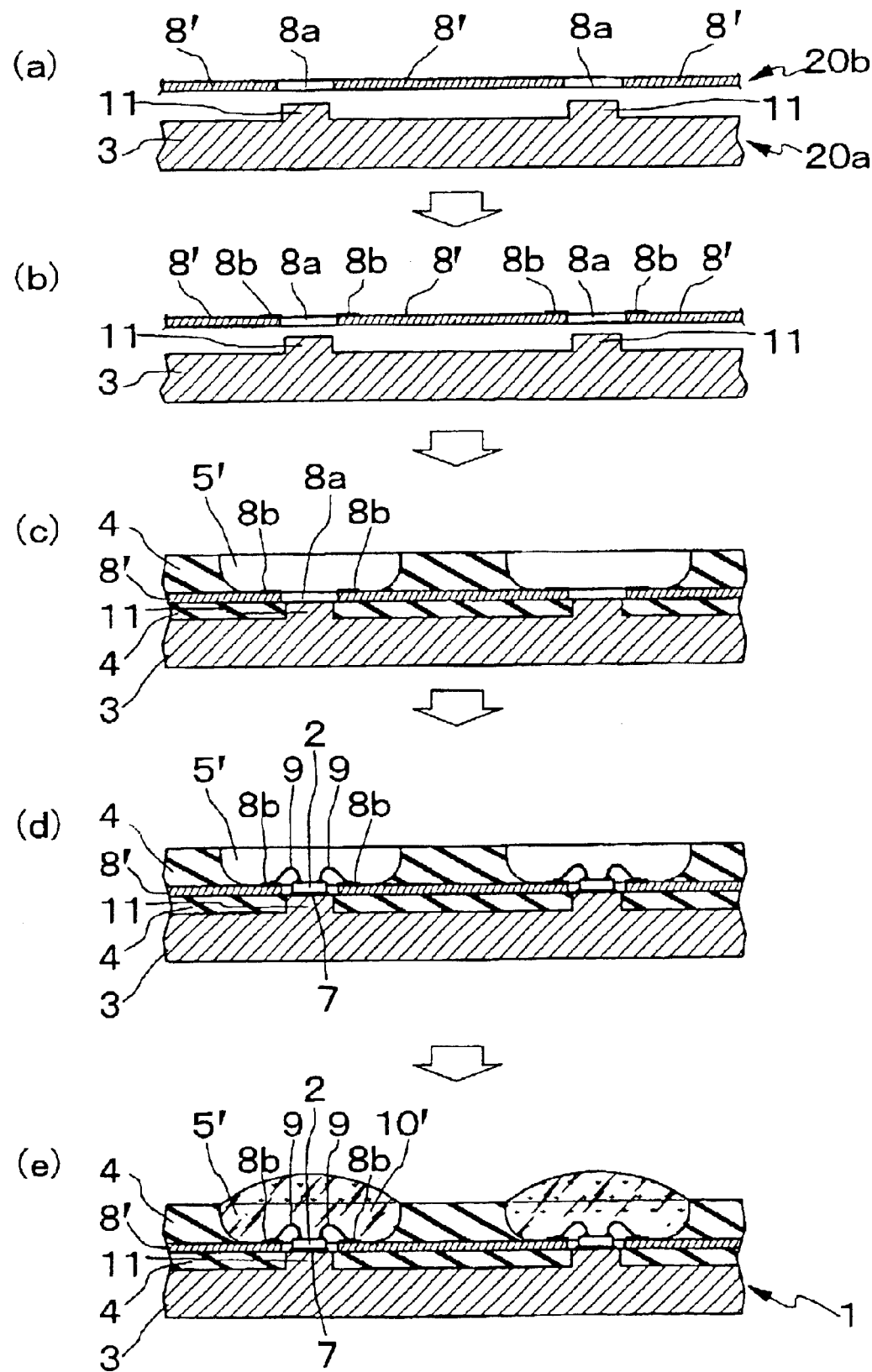
FIGS. 22a to 22e are cross sectional views of steps of a light source apparatus producing method showing Embodiment 22 of the present invention.

The method starts with a first step of providing the radiator plate 3 and an electrically conductive wiring sheet. The radiator plate 3 having each projection 11 provided upright on one side thereof is provided by punching and shaping a lead frame 20a of about 1 mm thick (See FIG. 22a). Separately, a lead flame 20b of about 0.2 mm thick is blanked and shaped to develop a wiring pattern 8' which has each through hole 8a provided therein for accepting the corresponding projection 11 (FIG. 22a). The lead frames 20a and 20b may be made of a highly electrical and thermal conductive material such as copper or 42 alloy.

A second step follows for plating the radiator plate 3 and the electrically conductive wiring sheet. The projection 11 to which the LED chip 2 is mounted by die bonding and the wiring pattern 8' to which the bonding wires 9 are joined are locally subjected to electrolytic nickel plating or electrolytic silver plating. The wire pads 8b of the wiring pattern 8 to which the bonding wires 9 are joined may be electrolytic gold plated but not electrolytic silver plated for ease of joining the bonding wires 9 (See FIG. 22b).

Figure 23:
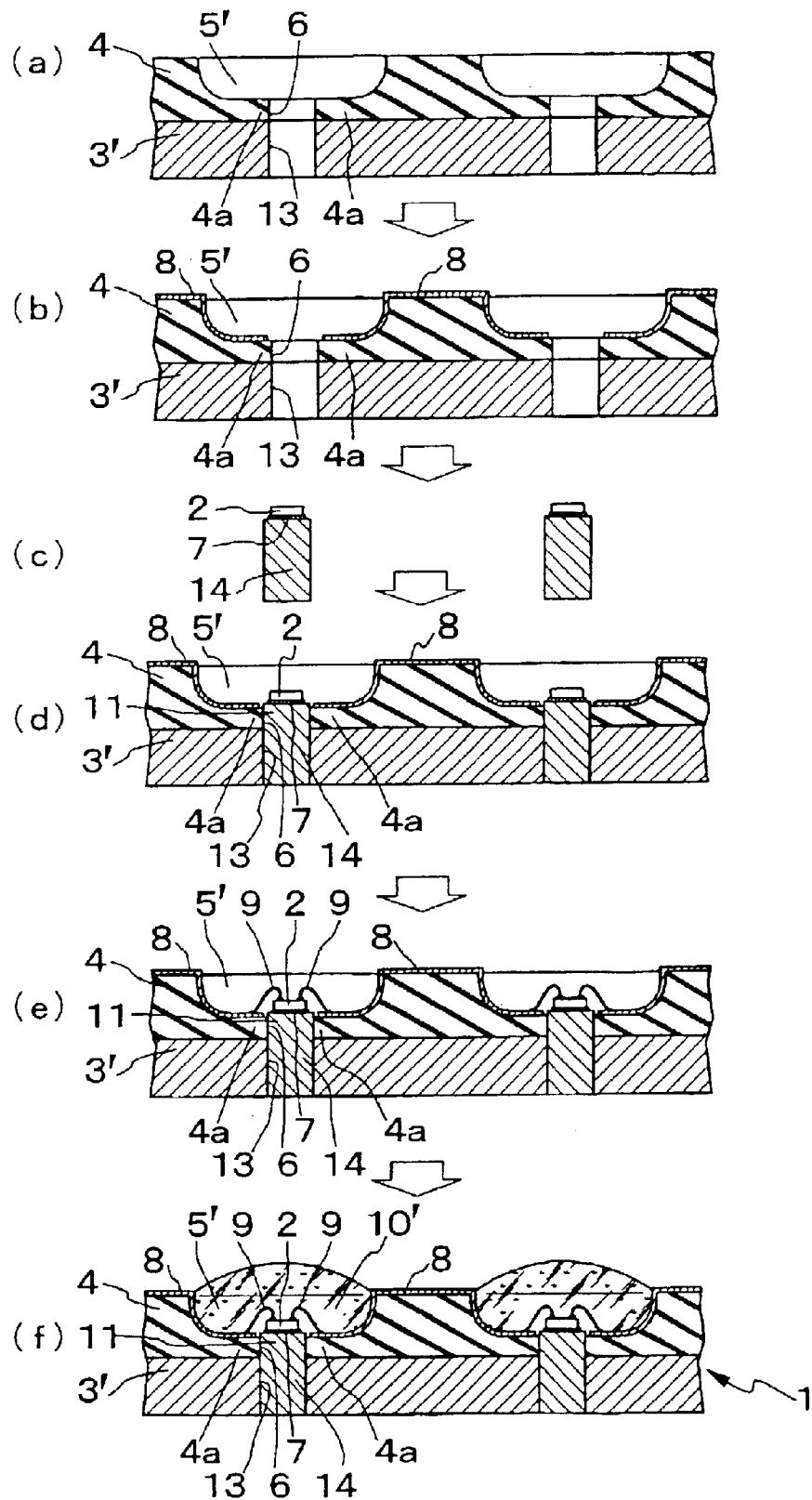
FIGS. 23a to 23f are cross sectional views of steps of a light source apparatus producing method showing Embodiment 23 of the present invention.
Figure 24:
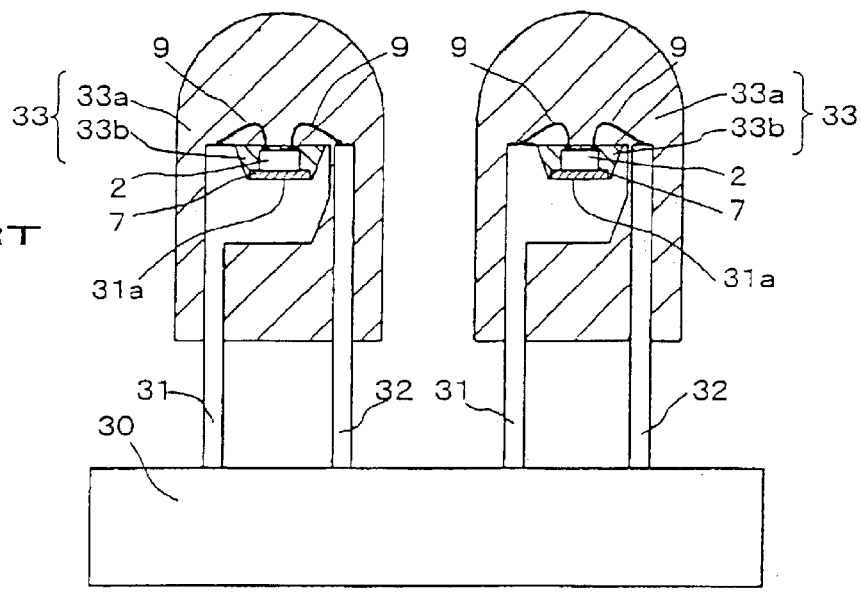
FIG. 24 is a cross sectional view showing a conventional light source apparatus.
Figure 25:
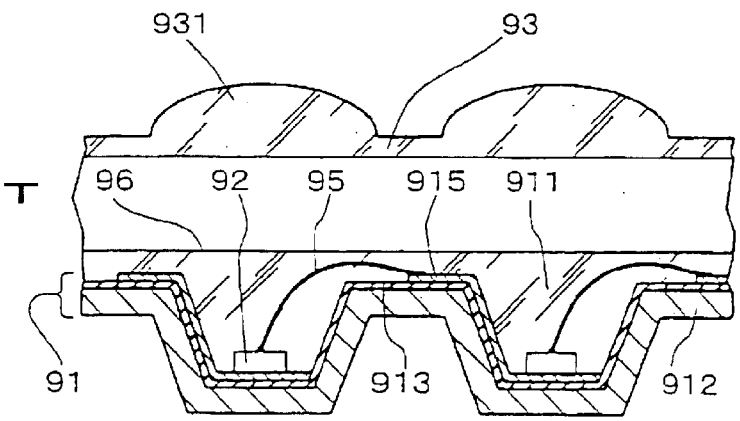
FIG. 25 is a cross sectional view showing another conventional light source apparatus.

This is followed by a third step of insert forming to shape the insulating member 4 coupled with the radiator member 3 and the electrically conductive wiring sheet. The insulating member 4 may be made of liquid crystal polymer, polyphthalamide, polyphthalsulfone, epoxy, SPS, or PBT. The insulating member 4 are joined by insert forming with the radiator plate 3 and the locally plated wiring pattern 8' (FIG. 23c). At the time, the upper surface of the projection 11 of the radiator plate 3 and the wire pads 8b of the wiring pattern 8' remain exposed at each recess 5' of the insulating member 4.

A fourth step follows for die bonding and electrical connection. The blue color LED chip 2 is die bonded by a transparent adhesive to the exposed surface of the projection 11 of the radiator plate 3 and electrically connected to the wire pattern 8' by wire bonding with bonding wires 9 which may preferably be 25 µm thick gold wires (See FIG. 22d).

Finally, a fifth step is carried out for sealing. The recess 5' is filled with the sealing resin (material) 10' which contains fluorescent particles dispersed into a resin base and excited by the blue light emitted from the LED chip 2 for complementing the blue color light with yellow color light. As the result, the LED chip 2 and the bonding wires 9 are encapsulated in the sealing resin 10' (See FIG. 22e).

In the conventional light source apparatus, the insulating member is shaped by machining prior to the mounting of the LED chip 2 and will hardly be low in the processing cost. Also, the surfaces of the LED chip 2 may easily be injured or roughened hence making the installation of the LED chip 2 difficult. According to the method of this embodiment, the radiator plate 3 and the insulating member 4 are shaped at once by insert forming and then the LED chip 2 is mounted to the exposed region of the radiator plate 3 projected from the through hole 6 in the insulating member 4. While the LED chip 2 mounting surface of the insulating member is flat, the pads for connection to the bonding wires 9 are flat and smooth. Accordingly, the installation of the LED chip 2 can easily be conducted. As the bonding wires 9 remain disposed in the recess 5' of the insulating member 4, it can hardly be exposed from the sealing resin 10' with which the recess 5' is filled up and its injury will be minimized in the probability thus contributing to the operational reliability of the apparatus. In addition, as the radiator plate 3 and the insulating member 4 are shaped at once by insert forming, the step of joining the two components can be eliminated and the overall production cost will be minimized.

Embodiment 23

A method of producing the light source apparatus according to Embodiment 23 of the present invention will be described step by step referring to FIGS. 23a to 23f. As the arrangement of the light source apparatus 1 is identical to that of Embodiment 6, like components are denoted by like numerals and will be explained in no more detail.

The method starts with a first step of insert forming to prepare the insulating member 4 coupled to the base plate 3'. The insulating member 4 may be made of liquid crystal polymer, polyphthalamide, polyphthalsulfone, epoxy, SPS, or PBT. The base plate 3' may be made of a highly thermal conductive material such as silver, aluminum, or copper. The base plate 3' and the insulating member 4 are shaped at once by insert forming (See FIG. 23a).

A second step then follows for providing the wiring pattern 8. More specifically, a thin copper base layer of 0.3 µm thick is first deposited by vacuum vapor deposition, DC sputtering, or RF sputtering on the exposed side of the insulating member 4. Then, the thin copper base layer on the base plate 3' is exposed to an electromagnetic wave, such as laser beam, to remove unwanted regions of the base layer. More specifically, the laser beam may preferably be YAG laser which can easily be absorbed by the base layer. For example, the laser beam is irradiated to the other insulating regions (referred to as non-circuit regions hereinafter) than the (wiring) circuit pattern 8 by scanning with a galvanomirror. The laser beam is scanned at least along the non-circuit regions at the edge of the circuit pattern to remove the base layer of the non-circuit regions. Then, the circuit pattern is energized for electrolytic copper plating, electrolytic nickel plating, or electrolytic silver plating to develop a patterned metal layer of a desired thickness. After the non-circuit regions are cleared off by e.g. soft etching, a desired thickness metal layer of the wiring pattern 8 is completed (See FIG. 23b). The electrolytic silver plating may be replaced by electrolytic gold plating. The material and the thickness of the plating can preferably be determined depending on the efficiency of light reflection and the labor of wiring process.

This is followed by a third step for die bonding the assembly with each thermally conductive member 14 which is separately prepared. More specifically, the thermally conductive member (projection) 14 is a (round or square) column shaped solid made of a highly thermal conductive material such as aluminum or copper. The LED chip 2 is die bonded to the upper surface of the thermally conductive member 14 by a transparent bonding paste (See FIG. 23c).

A fourth step then follows for pressing each thermally conductive member 14 into the base plate 3'. More particularly, the thermally conductive member 14 having the LED chip 2 mounted thereon is inserted from the base plate 3' side under pressure into a couple of corresponding through holes 13 and 6 provided in the base plate 3' and the insulating member 4 respectively (FIG. 23d). As the thermally conductive member 14 is inserted under pressure into the through hole 13 in the base plate 3', it can fit closely to the base plate 3' thus increasing the thermal conductivity between the thermally conductive member 14 and the base plate 3'.

This is followed by a fifth step of electrical connection. The LED chip 2 is electrically connected at its electrodes to the wiring pattern 8 by bonding wires 9 which may preferably be 25 µm thick gold wires (See FIG. 23e).

Finally, a sixth step is carried out for sealing. The recess 5' is filled with the sealing resin (material) 10' which contains fluorescent particles dispersed into a resin base and excited by the blue light emitted from the LED chip 2 for complementing the blue color light with yellow color light. As the result, the LED chip 2 and the bonding wires 9 are encapsulated in the sealing resin 10' (See FIG. 23f).

The light source apparatus produced by the method of this embodiment has each LED chip 2 mounted preliminarily on the thermally conductive member 14. As the LED chip 2 mounting region of the thermally conductive member 14 is arranged flat and smooth, the installation of the LED chip 2 can easily be conducted. Also, since the thermally conductive member 14 acting as the projection 11 on which the LED chip 2 is mounted is inserted under pressure into the through hole 13 in the base plate 3', the overall production cost will be minimized as compared with the shaping of the projection 11 by machining.

The dimensions of each component are not limited to those of the foregoing embodiments and may arbitrarily be determined depending on the requirements.

It would be understood that the scheme that the sealing resin contains applicable fluorescent particles for ease of converting the color of light emitted from the LED chip 2 is disclosed in some embodiments and applicable to any of the embodiments.

The priority right pertinent to Japanese Patent Application 2001-114502 filed on Apr. 13, 2001 shall be declared in this application. The teachings of the above application and the other Japanese application 2000-213218 filed on Jul. 13, 2000 are cited and embraced in this application.

Industrial Applications

The present invention is widely applicable to a number of primary industries employing a power of light converted from electric energy as the light source. Among the light source for emanating a large power of light while the effect of heat radiation being improved are a light source for illumination, a light source for indicating the action of a switch, a light source in a traffic signal, a light source for displaying an alarm in an automobile, and a light source for advertisement.

What is claimed is:

1. A light source apparatus for emitting light from a LED chip, comprising:
   a radiator plate having thermally conductive properties;
   an insulator positioned on at least one side of the radiator plate having a through hole facing the radiator plate;
   the LED chip being mounted on and thermally coupled to an exposed portion of the radiator plate facing the through hole;
   a wiring pattern positioned on the insulator and electrically isolated by the insulator from the radiator plate;
   connectors that electrically connect the wiring pattern to electrodes of the LED chip; and
   sealing material in the through hole that entirely encapsulates the LED chip and the connectors,
   wherein portions of the wiring pattern electrically connected by the connectors to the LED chip are located in a bottom of the through hole adjacent to the radiator plate.

2. The light source apparatus according to claim 1, wherein the portions of the wiring pattern electrically connected by the connectors to the LED chip are located in the through hole which is filled to an opening of the through hole with the sealing material.

3. The light source apparatus according to claim 1, wherein the insulator has an inwardly projecting extension at the radiator plate side of the through hole and on which at least portions of the wiring pattern are arranged, the radiator plate has a projection provided on the insulator side configured for insertion into the through hole in the insulator and on which the LED chip is arranged and thermally coupled to the radiator, and the portions of the wiring pattern on the extension are electrically connected to the electrodes of the LED chip.

4. The light source apparatus according to claim 3, wherein the connectors are metal wires, and a portion of the LED chip to which each metal wire is connected at one end is substantially flush with a portion of the wiring pattern to which the other end of each metal wire is connected.

5. The light source apparatus according to claim 3, wherein the top of the projection on which the LED chip is mounted is substantially flush with a portion of the wiring pattern to which the LED chip is electrically connected.

6. The light source apparatus according to claim 3, wherein the projection comprises a stamping of the radiator plate from the side opposite to the insulator side having a raised region corresponding to the insulator side.

7. The light source apparatus according to claim 3, wherein the radiator plate comprises a base plate having a through hole for communicating with the through hole of the insulator and a projection configured to fit into the through hole of the insulator and to extend into the insulator to form the projection.

8. The light source apparatus according to claim 3, wherein there is a gap between the through hole and the projection.

9. The light source apparatus according to claim 1, wherein at least one of the insulator and the radiator plate has a groove adjacent the through hole on a the coupling side thereof that is configured to accept an adhesive for coupling the insulator and the radiator plate.

10. The light source apparatus according to claim 1, wherein the radiator plate comprises an electrically conductive material and is configured to serve as a portion of the wiring pattern for electrically connecting the radiator plate to the LED chip.

11. The light source apparatus according to claim 10, wherein the radiator plate comprises at least two radiator plate segments which are electrically isolated from each other.

12. The light source apparatus according to claim 1, wherein the sealing material is arranged, at a surface, in a lens shape for irradiating the light emitted from the LED chip in a desired direction.

13. The light source apparatus according to claim 1, wherein a side wall of the through hole of the insulator is covered with a reflective coating for reflecting the light emitted from the LED chip in a desired direction.

14. The light source apparatus according to claim 1, wherein the sealing material has a color for converting at least a part of the light emitted from the LED chip into a desired color light.

15. The light source apparatus according to claim 14, wherein the sealing material is located closer to the radiator plate side than the other side of the insulator and the side wall at the through hole of the insulator is covered with a reflective coating for reflecting the light emitted from the LED chip in a desired direction.

16. The light source apparatus according to claim 1, wherein end portions of the wiring pattern extend to the radiator plate and are configured to serve as external connector terminals.

17. The light source apparatus according to claim 16, wherein the end portions of the wiring pattern extend to the radiator plate side of the insulator.

18. The light source apparatus according to claim 16, wherein portions of the insulator extend to the radiator plate where they are substantially flush with the other side of the radiator plate opposite to the insulator side.

19. The light source apparatus according to claim 1, wherein a combination of the insulator, the LED chip, the wiring pattern, and the sealing material are provided on each side of the radiator plate.

20. A method of producing a light source apparatus for emitting light from a LED chip comprising:
    preparing an insulator which has a through hole provided therein to extend from a front side for emitting the light to a back side;
    providing a wiring pattern on the front side of the insulator for feeding power to the LED chip;
    coupling a thermally conductive radiator plate to the back side of the insulator;
    installing and thermally coupling the LED chip to a corresponding portion of the radiator plate projected from the through hole and electrically connecting electrodes of the LED chip to the wiring pattern by connectors; and
    filling the through hole with a sealing material to entirely encapsulate the LED chip and the connectors.

21. A method of producing a light source apparatus for emitting light from an LED chip, comprising:
    forming an insulator of an insulating material that has a through hole, the insulator through hole having a front side for emitting the light and a back side, and a radiator plate which has thermally conductive properties coupled to the back side of the insulator;

providing a wiring pattern on the front side of the insulator for feeding power to the LED chip;

installing and thermally coupling the LED chip to a corresponding portion of the radiator plate projecting from the through hole and electrically connecting electrodes of the LED chip to the wiring pattern by connectors; and filling the through hole with a sealing material to entirely encapsulate the LED chip and the connectors.

22. A method of producing a light source apparatus for emitting light from a LED chip, comprising:

preparing a thermally conductive radiator plate and an electrically conductive sheet to serve as a wiring pattern for feeding power to the LED chip;

plating the radiator plate and the electrically conductive sheet;

forming the electrically conductive sheet spaced from the radiator plate and forming an insulator of an insulating material;

installing and thermally coupling the LED chip to a corresponding portion of the radiator plate projected from a through hole provided in the insulator, the through hole having a front side for emitting the light and a back side, and electrically connecting the electrodes of the LED chip to the wiring pattern by connectors; and filling the through hole with a light-transmissive sealing material to entirely encapsulate the LED chip and the connectors.

* * * * *

UNITED STATES PATENT AND TRADEMARK OFFICE
CERTIFICATE OF CORRECTION

PATENT NO. : 6,874,910 B2
DATED : April 5, 2005
INVENTOR(S) : M. Sugimoto et al.

It is certified that error appears in the above-identified patent and that said Letters Patent is hereby corrected as shown below:

Column 31,
Line 67, before "coupling" delete "the".

Column 32,
Line 46, after "chip" insert -- , --.

Signed and Sealed this

Twentieth Day of December, 2005

JON W. DUDAS
*Director of the United States Patent and Trademark Office*